(12) United States Patent
Miles et al.

(10) Patent No.: US 7,728,697 B2
(45) Date of Patent: Jun. 1, 2010

(54) SYSTEMS AND METHODS FOR ELECTRICALLY REDUCING FERROELECTRIC MATERIALS TO INCREASE BULK CONDUCTIVITY

(75) Inventors: Ronald O. Miles, Menlo Park, CA (US); Ludwig Galambos, Menlo Park, CA (US)

(73) Assignee: MG Materials Corporation, Menlo Park, CA (US)

( * ) Notice: Subject to any disclaimer, the term of this patent is extended or adjusted under 35 U.S.C. 154(b) by 0 days.

(21) Appl. No.: 11/681,948

(22) Filed: Mar. 5, 2007

(65) Prior Publication Data

US 2008/0074211 A1 Mar. 27, 2008

Related U.S. Application Data

(60) Provisional application No. 60/847,483, filed on Sep. 26, 2006.

(51) Int. Cl.
*H03H 9/00* (2006.01)
(52) U.S. Cl. .................. 333/193; 310/311; 310/313 A; 310/313 B
(58) Field of Classification Search .................. 310/311
See application file for complete search history.

(56) References Cited

U.S. PATENT DOCUMENTS

| | | | |
|---|---|---|---|
| 4,410,823 A | 10/1983 | Miller et al. | |
| 5,249,250 A * | 9/1993 | Yamada et al. | ............... 385/122 |
| 5,766,340 A | 6/1998 | Geosling | |
| 5,838,702 A | 11/1998 | Byer et al. | |
| 5,856,880 A | 1/1999 | Farina et al. | |
| 6,319,430 B1 | 11/2001 | Bordui et al. | |
| 6,407,486 B1 | 6/2002 | Kamura et al. | |
| 6,932,957 B2 * | 8/2005 | Miles et al. | ............... 423/594.8 |
| 2003/0122061 A1 * | 7/2003 | Kawano et al. | ......... 250/214 R |
| 2003/0137735 A1 | 7/2003 | Shiono | |
| 2004/0187292 A1 * | 9/2004 | Miller et al. | .................. 29/594 |

(Continued)

FOREIGN PATENT DOCUMENTS

EP  0893515 A1  6/1998

(Continued)

OTHER PUBLICATIONS

Bredikhin, "Nonstoichiometry and Electrocoloration Due To Injection of LI+ and O2- Ions Into Lithium Niobate Crystals", Journal of Applied Physics 88(10):5687-5694, Nov. 15, 2000.

(Continued)

*Primary Examiner*—Walter Benson
*Assistant Examiner*—Bryan P Gordon
(74) *Attorney, Agent, or Firm*—Law Office of Andrei D. Popovici, PC

(57) ABSTRACT

According to some embodiments, a pre-poled, single-domain body of a ferroelectric crystalline material such as lithium tantalate or lithium niobate is electrically reduced by applying a voltage across the body in a non-oxidizing environment while the body is heated to a process temperature below its Curie temperature. The voltage generates an electric field along the polar axis of the body. Electrodes may be formed on the body surface by applying an acetate-based silver paint. Exemplary methods allow achieving electrical conductivity values of $10^{-11}$ to $10^{-9}$ Siemens/cm.

31 Claims, 18 Drawing Sheets

U.S. PATENT DOCUMENTS

| | | | |
|---|---|---|---|
| 2004/0221810 A1* | 11/2004 | Miles et al. | 118/715 |
| 2004/0255842 A1 | 12/2004 | Kajigaya et al. | |
| 2005/0036268 A1* | 2/2005 | Howald et al. | 361/234 |
| 2005/0066879 A1* | 3/2005 | Shiono | 117/2 |
| 2005/0145165 A1 | 7/2005 | Kajigaya et al. | |
| 2005/0214469 A1 | 9/2005 | Miles et al. | |
| 2005/0265916 A1 | 12/2005 | Jundt et al. | |
| 2005/0284359 A1 | 12/2005 | Hotta et al. | |
| 2006/0107888 A1* | 5/2006 | Jundt et al. | 117/1 |
| 2006/0169196 A1* | 8/2006 | Shiono | 117/2 |

FOREIGN PATENT DOCUMENTS

| | | |
|---|---|---|
| WO | WO2004030046 A1 | 4/2004 |
| WO | WO2004030047 A1 | 4/2004 |
| WO | WO-2008/039775 A2 | 4/2008 |

OTHER PUBLICATIONS

Klingler et al., "Coulometric Titration of Substituted $Li_xLa_{(2-x)/3}TiO_3$", Ionics 3:289-291, 1997.

Klingler et al., "In-Situ Formation of Local Inhomogeneities in Semiconductors", Ionics 3:412-419, 1997.

Sinclair et al., "Electrical Properties of a $LiTaO_3$ Single Crystal", Physical Review B 39(18):13486-13492, Jun. 15, 1998.

Huanosta, "The Electrical Properties of Ferroelectric $LiTaO_3$ and Its Solid Solutions", Journal of Applied Physics 61(12):5386-5391, Jun. 15, 1987.

International Search Report and Written Opinion for PCT International App. No. PCT/US07/79424.

* cited by examiner

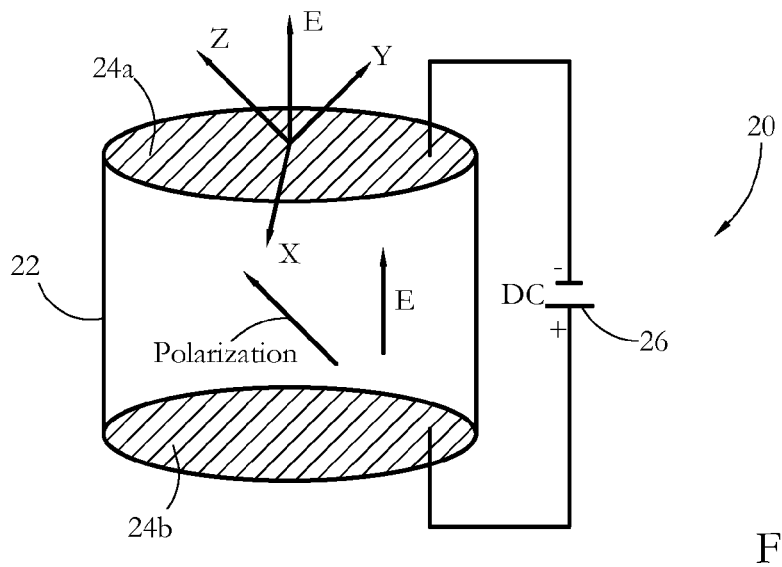
FIG. 1
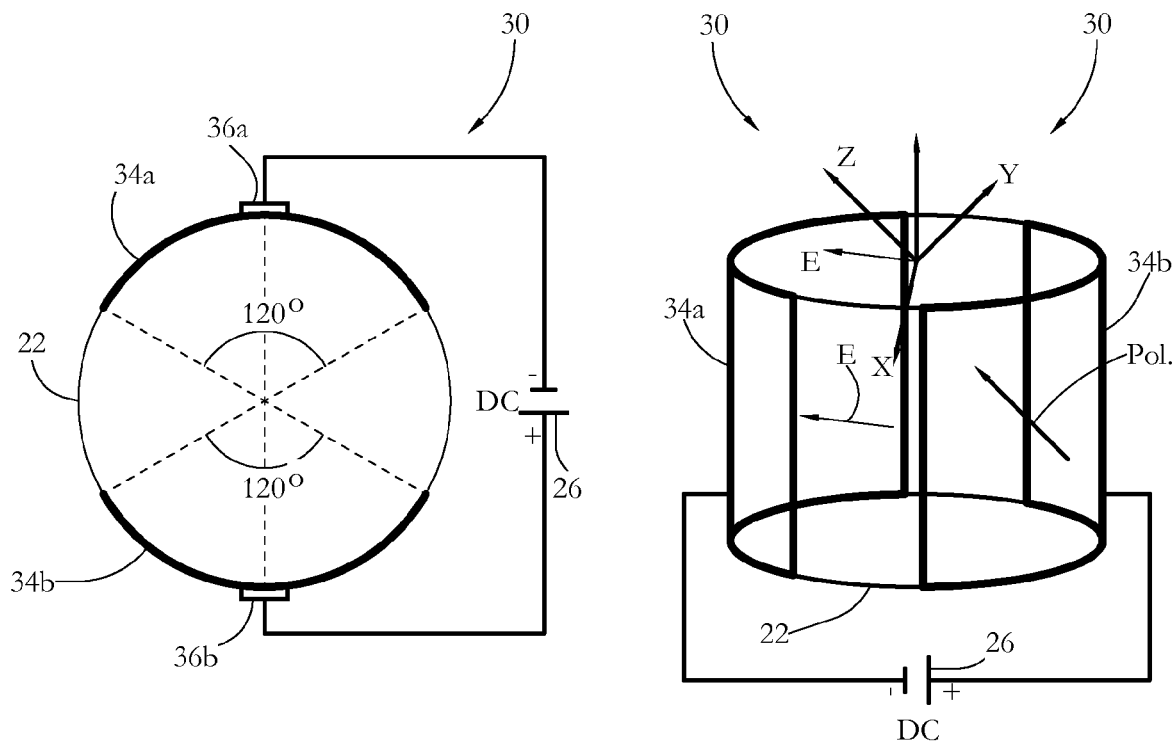
FIG. 2-A
FIG. 2-B

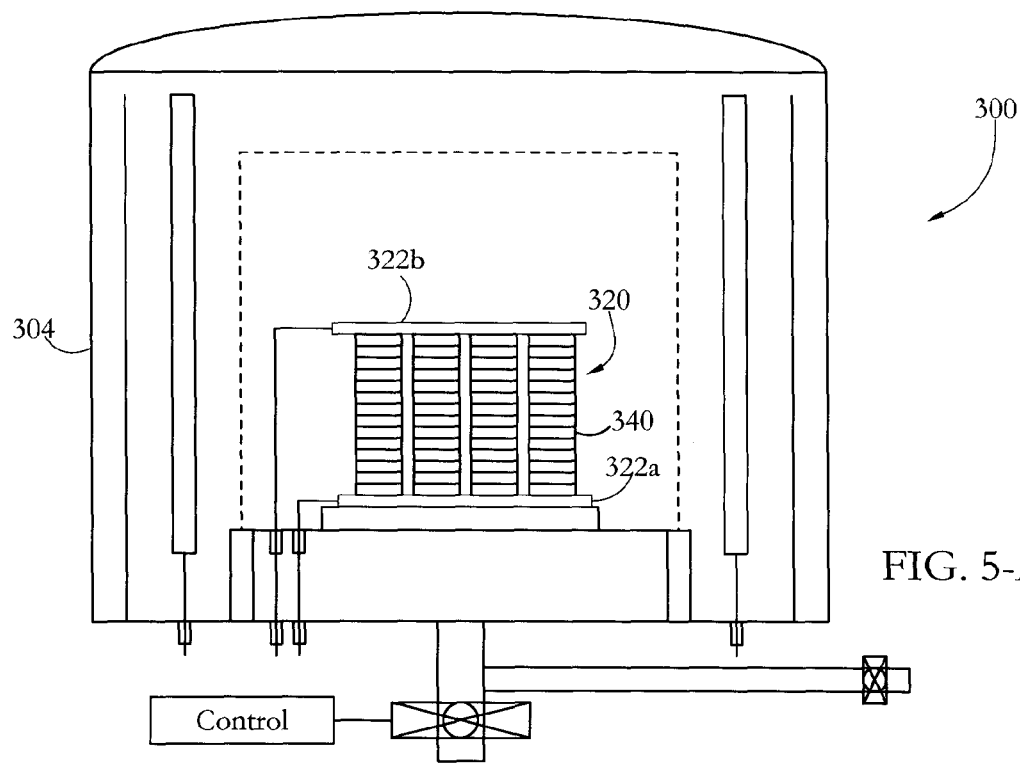
FIG. 5-A
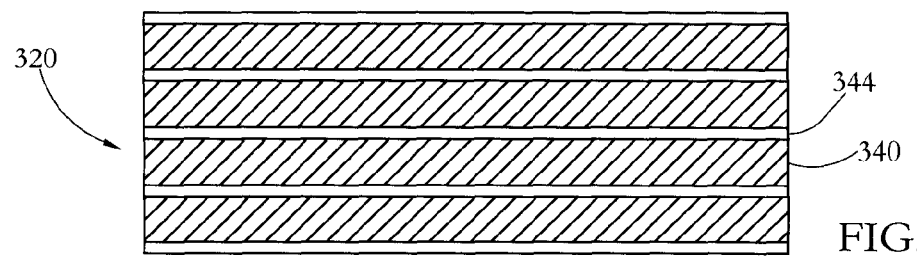
FIG. 5-B

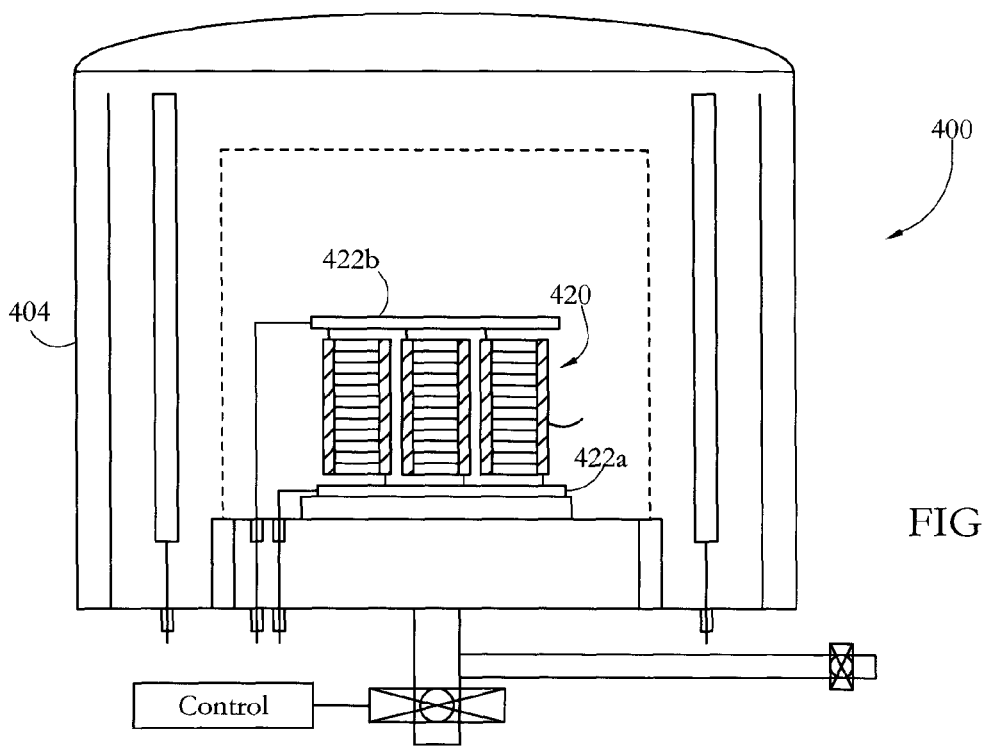
FIG. 6-A
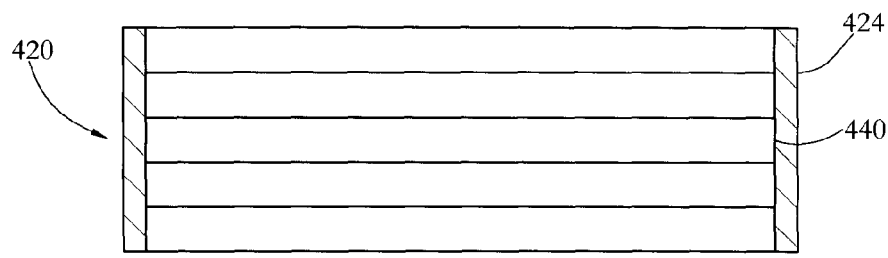
FIG. 6-B

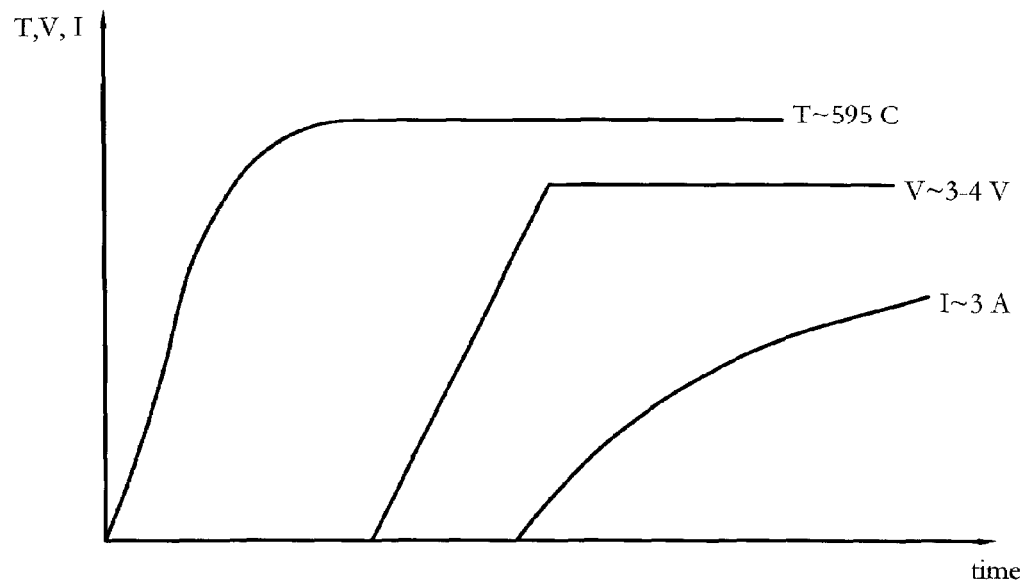
FIG. 8-A
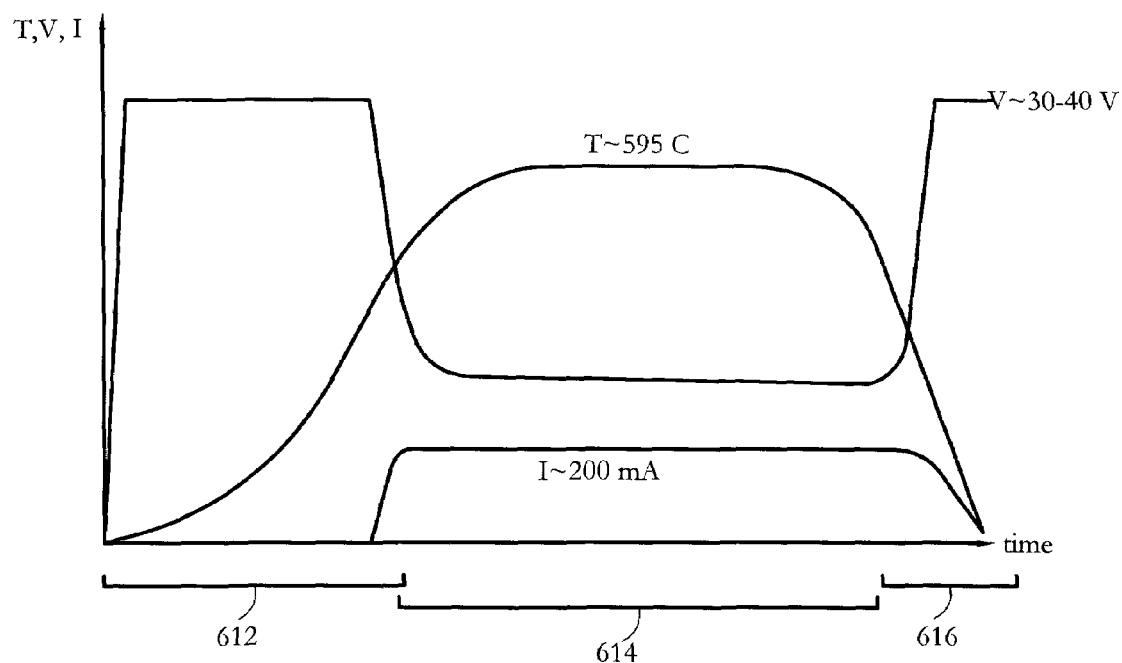
FIG. 8-B

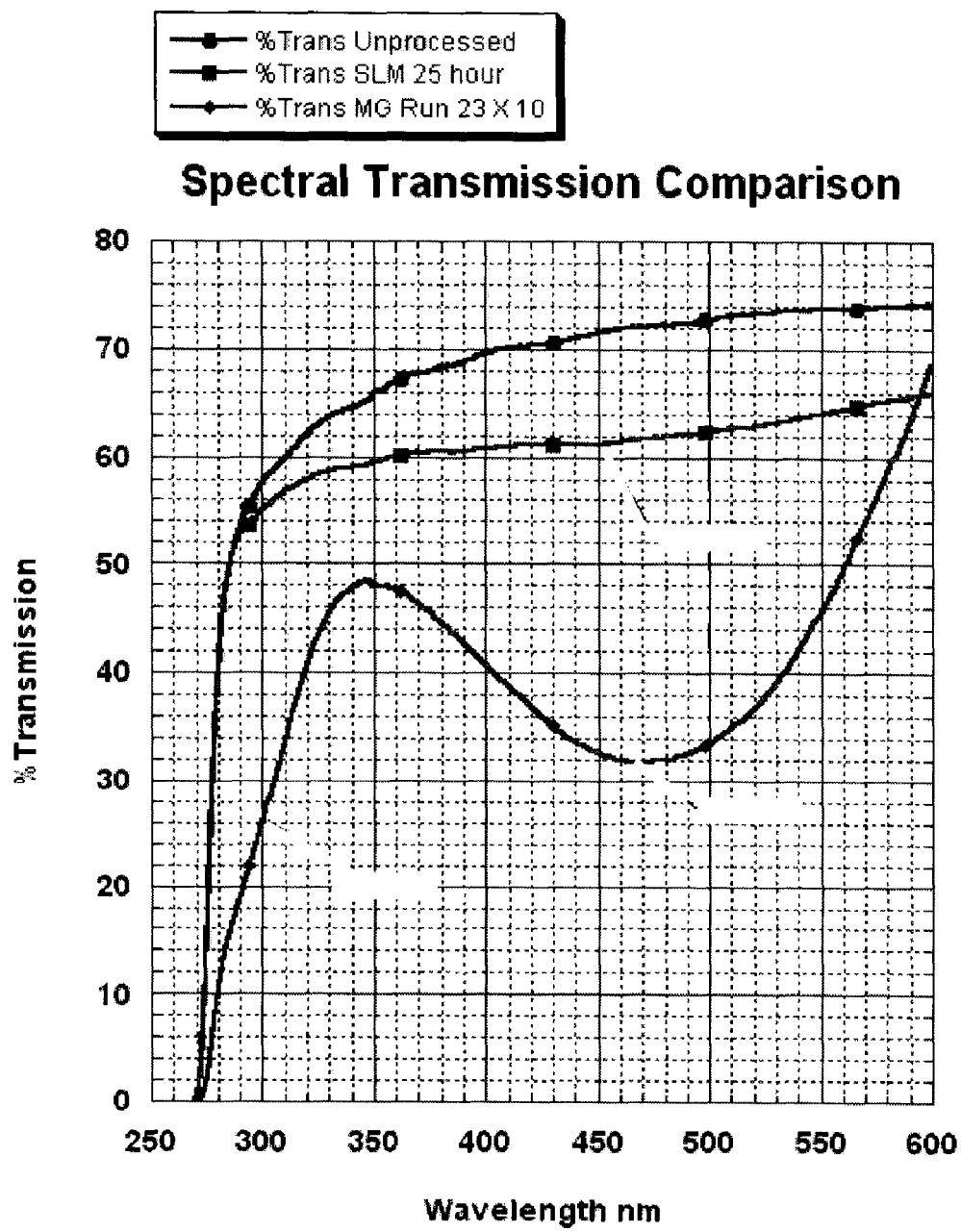
FIG. 10-A

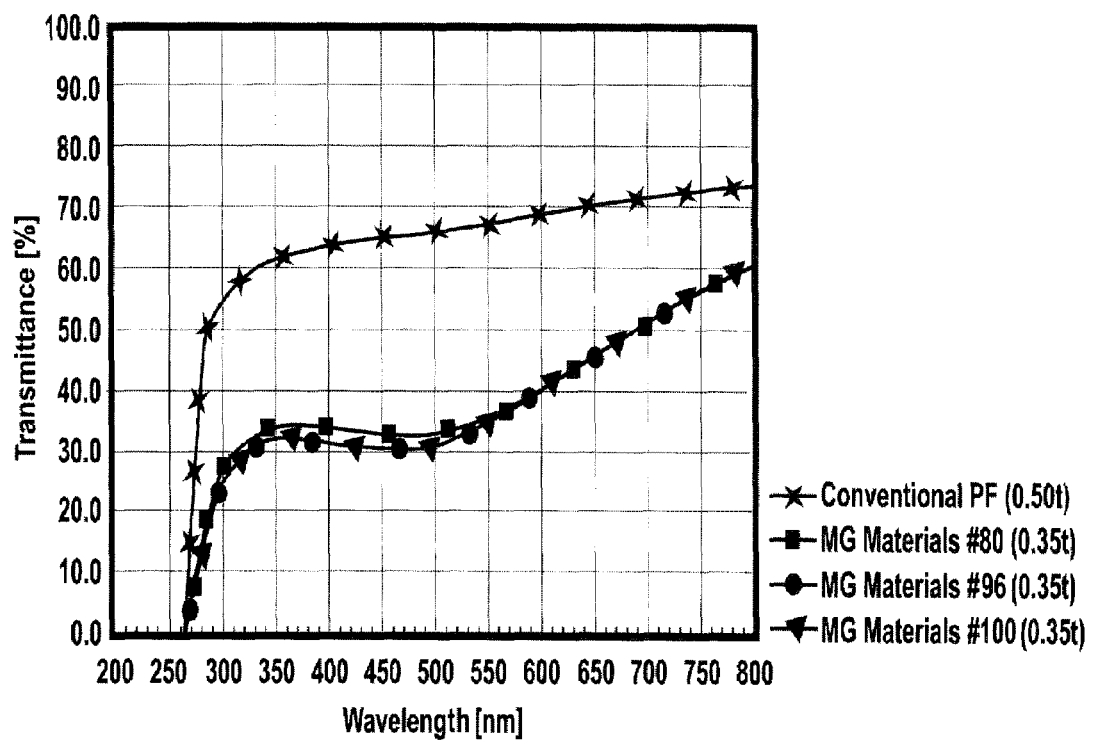
FIG. 10-B

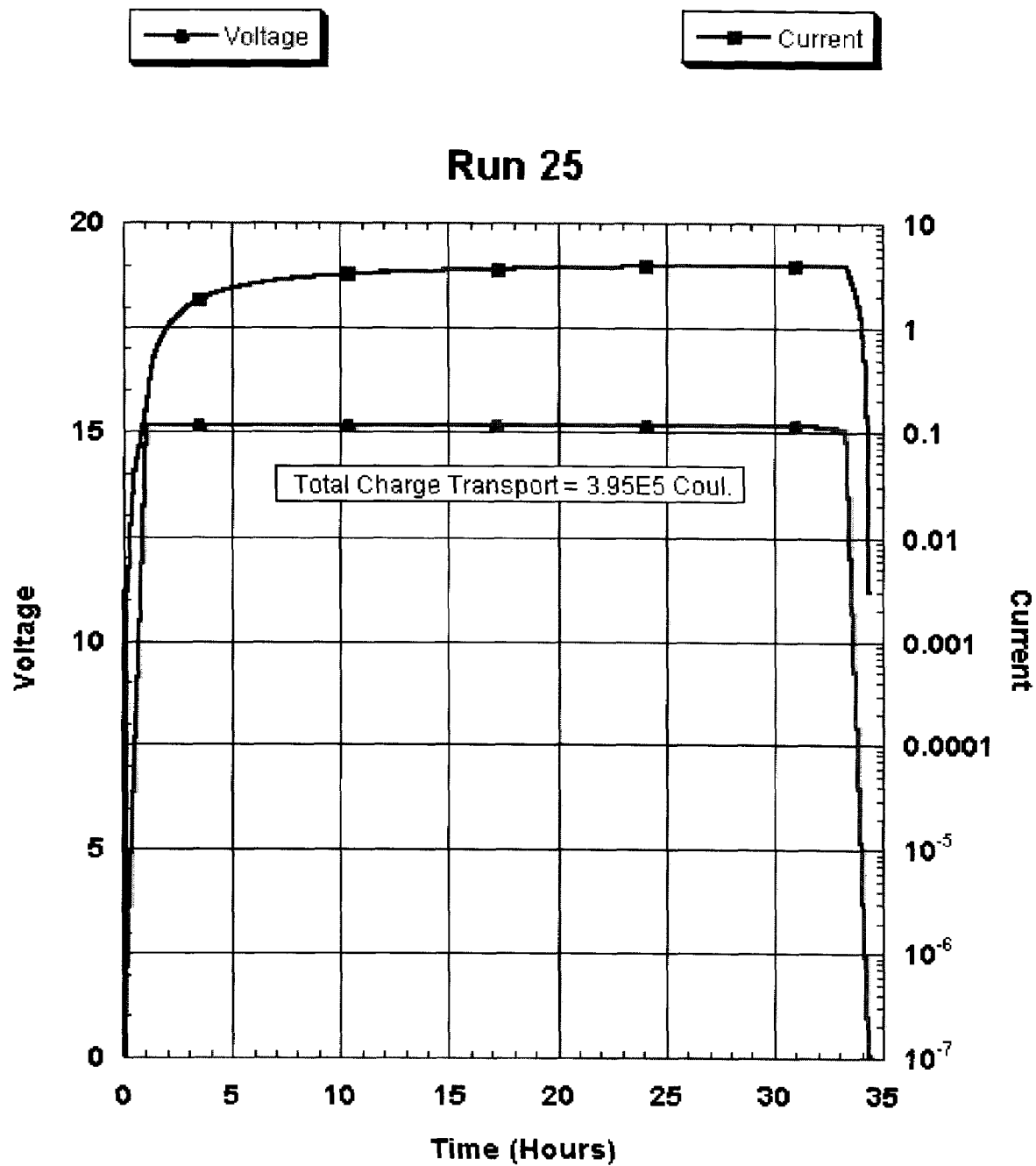
FIG. 11-A

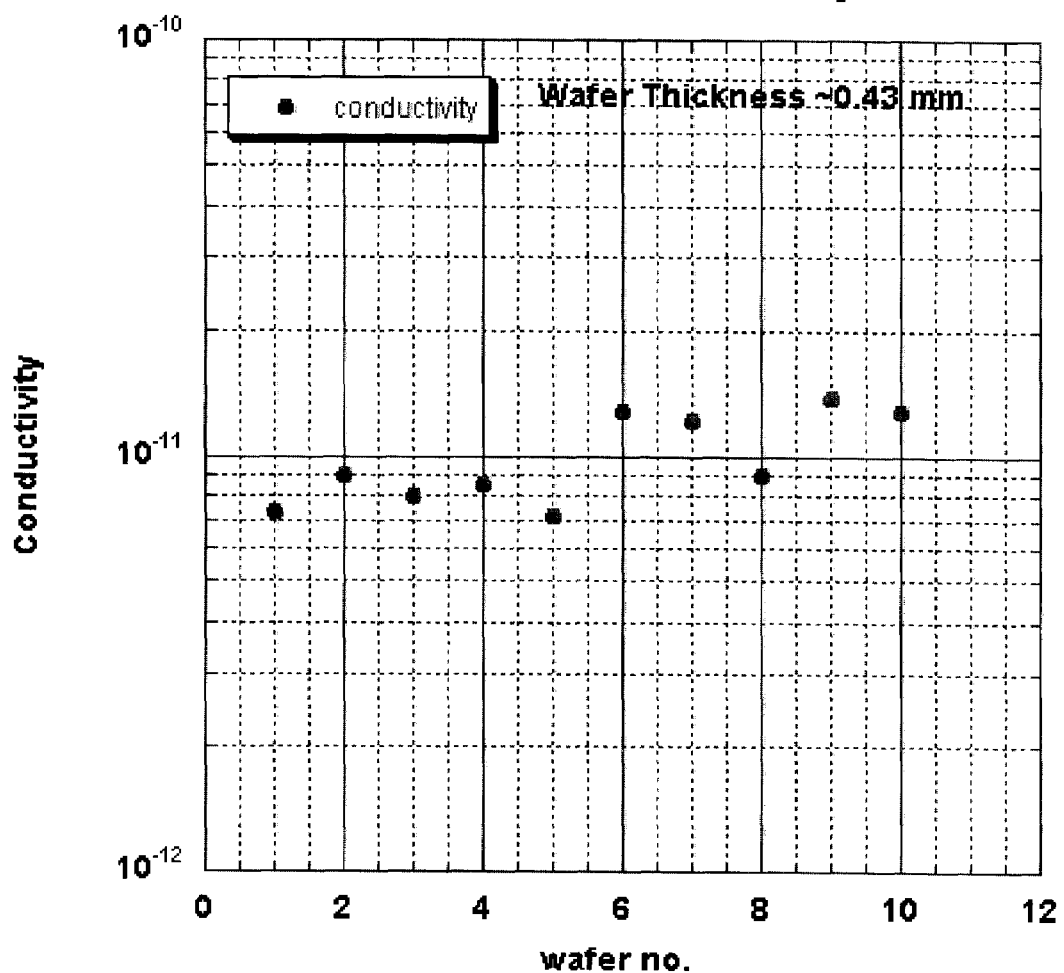
FIG. 11-B

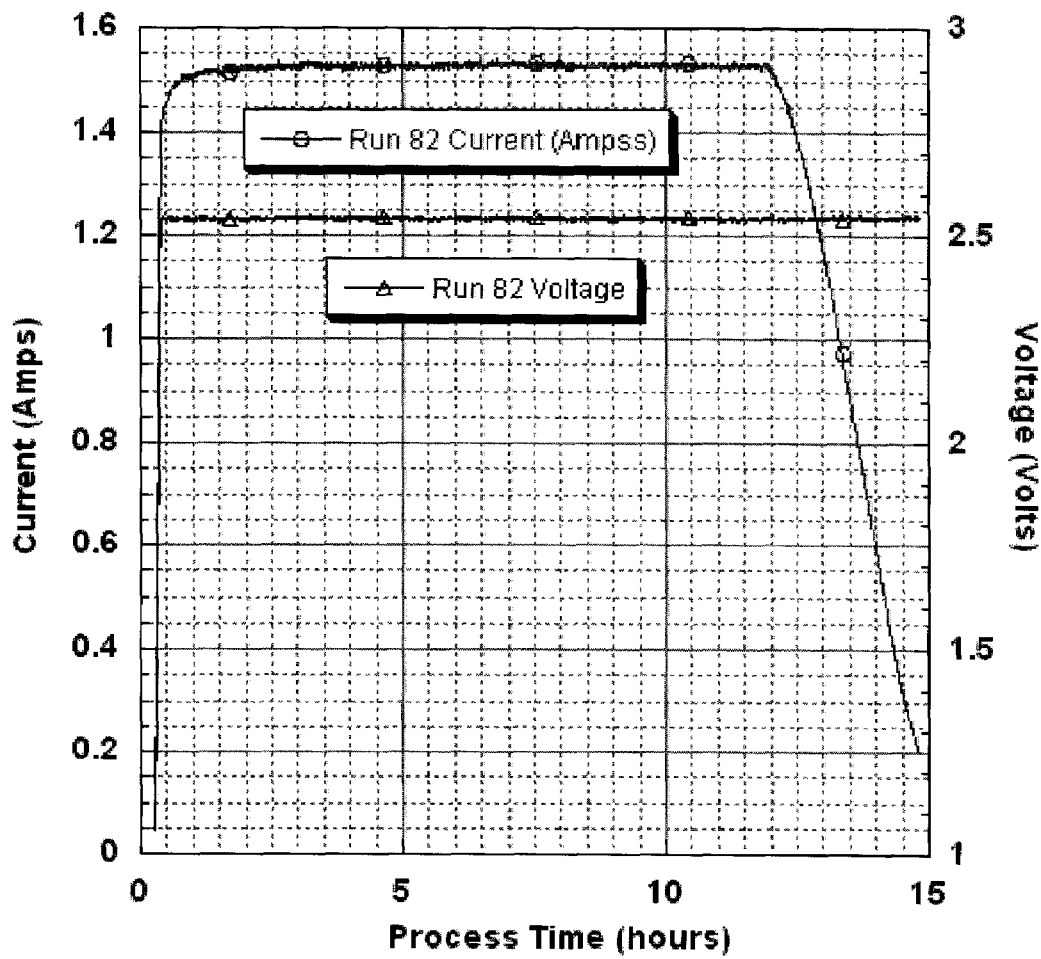
FIG. 12-A

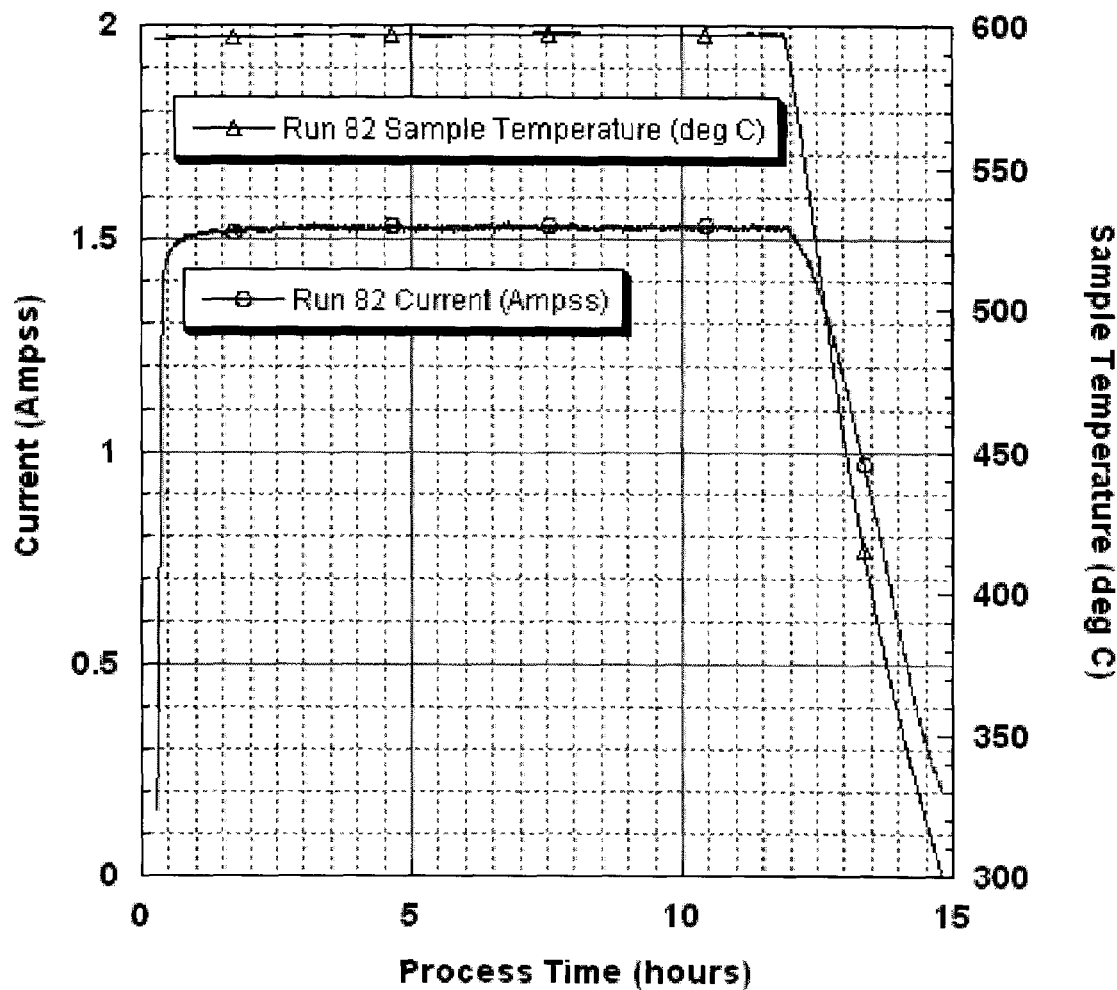
FIG. 12-B

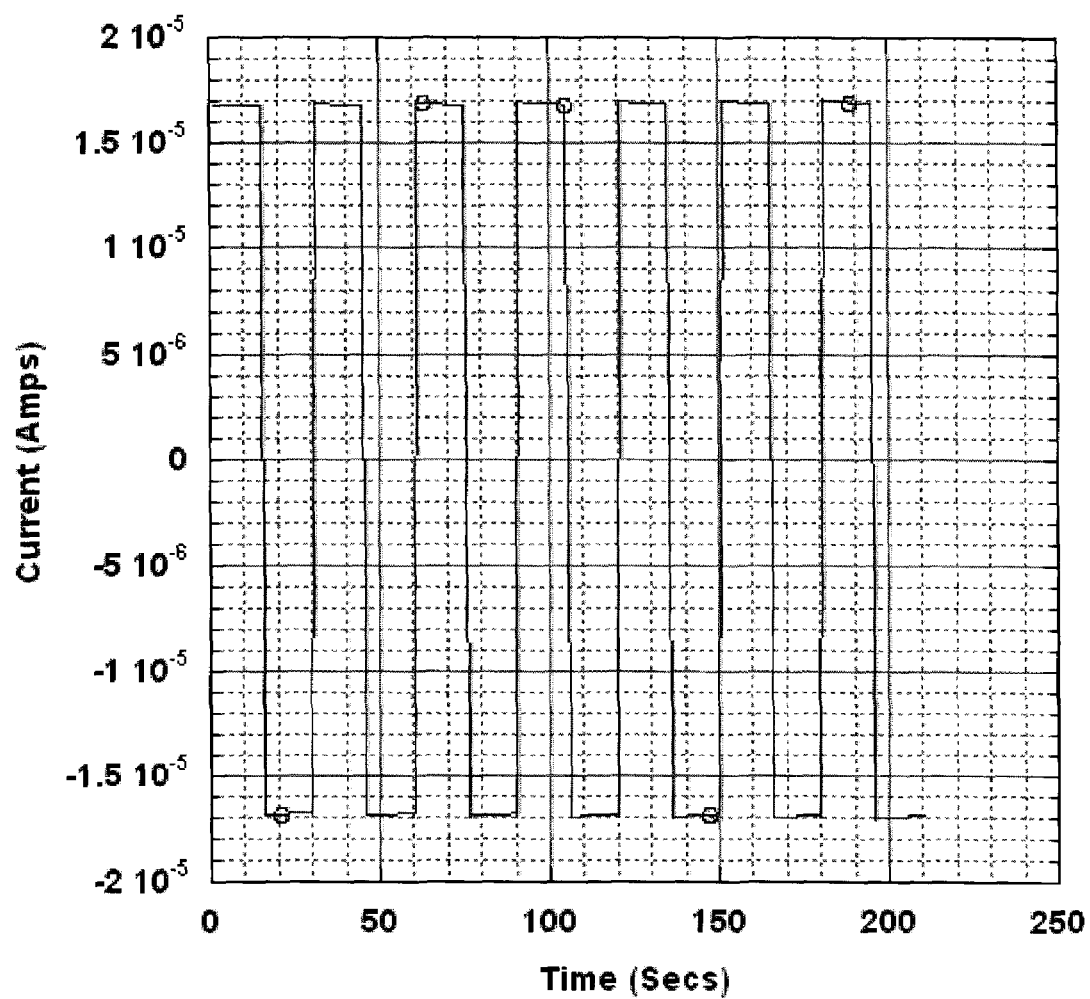
FIG. 12-C

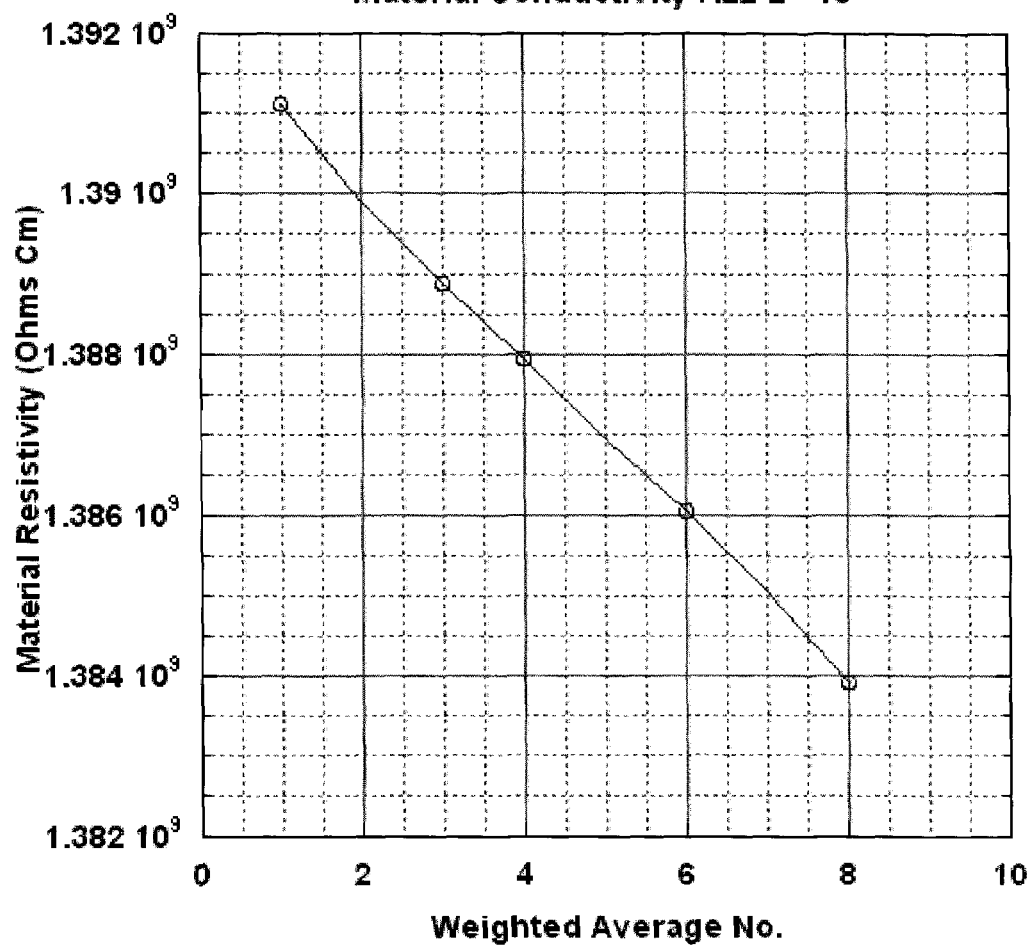
FIG. 12-D

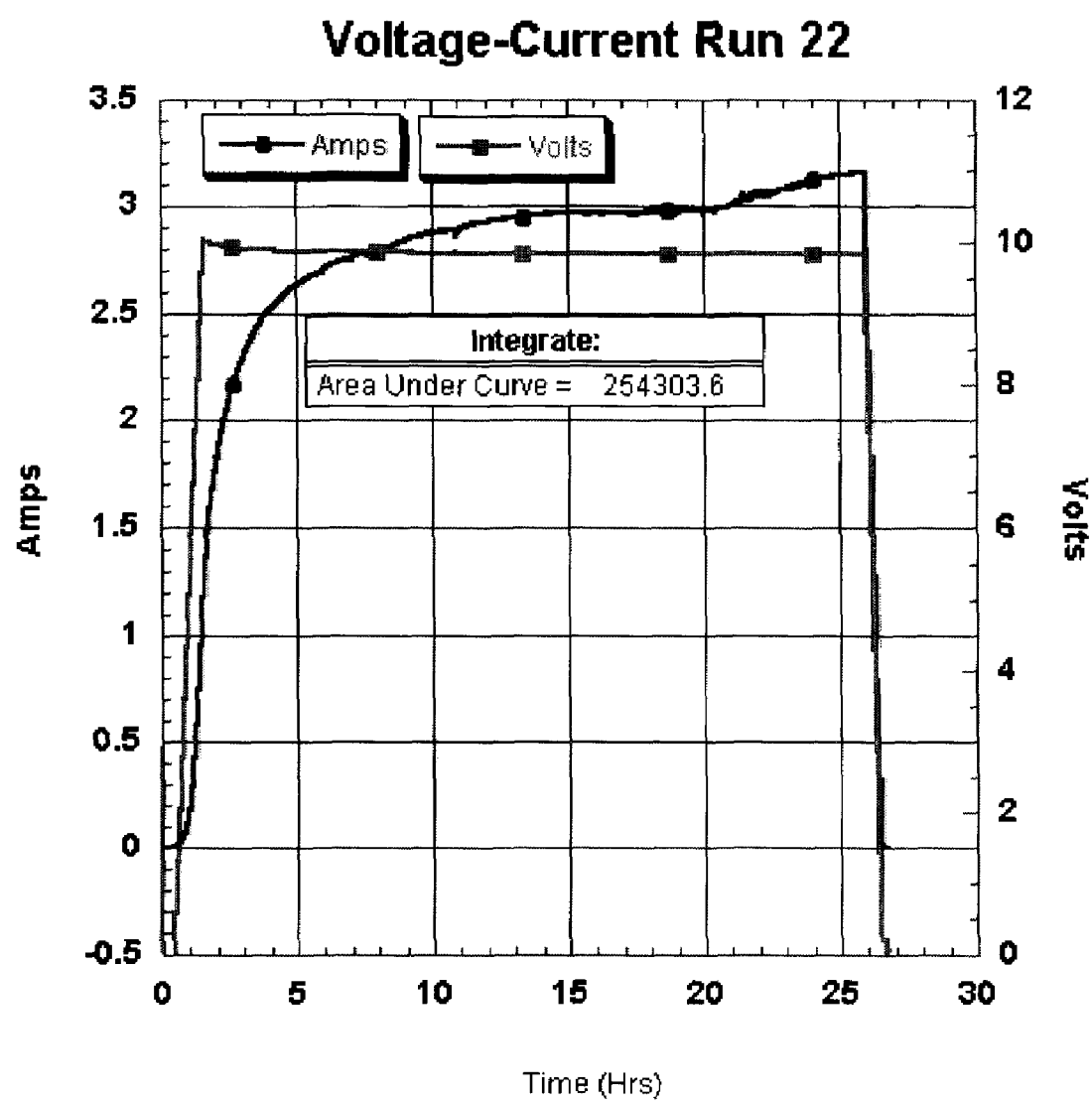
FIG. 13-A

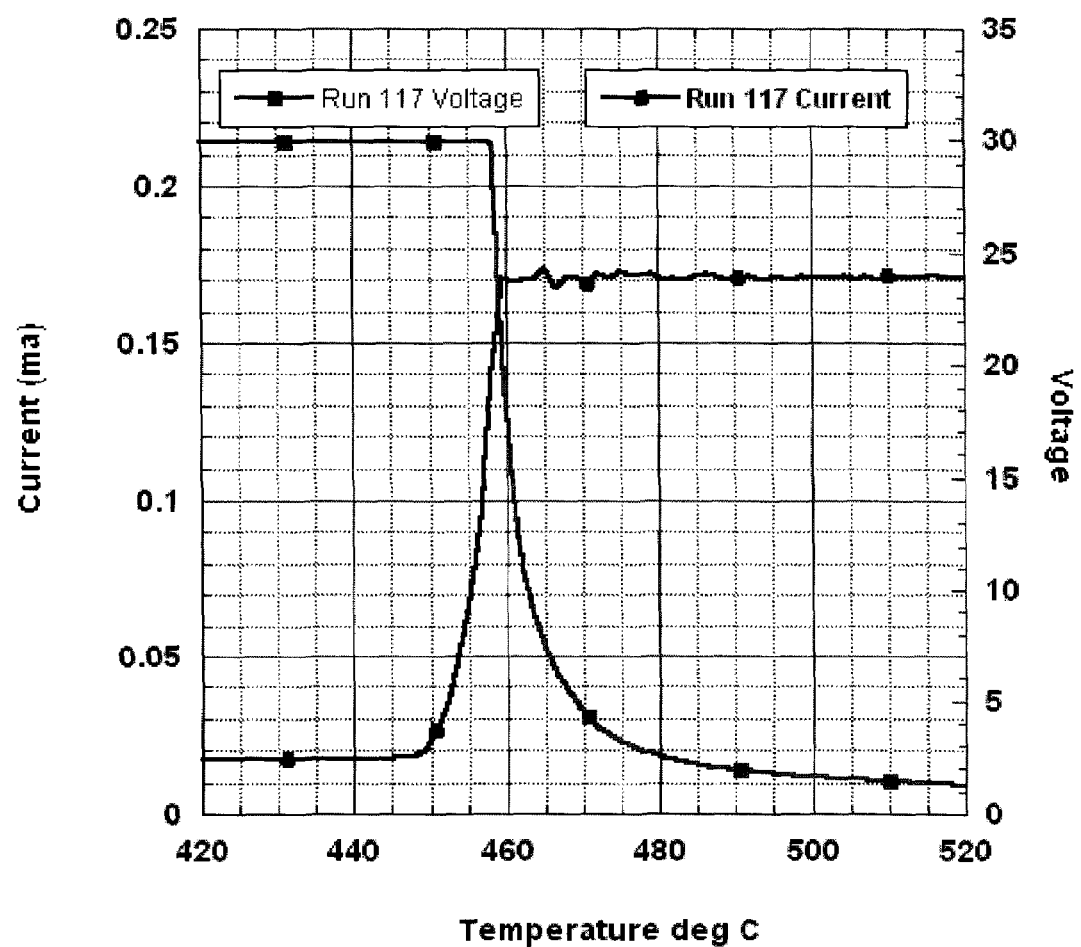
FIG. 13-B

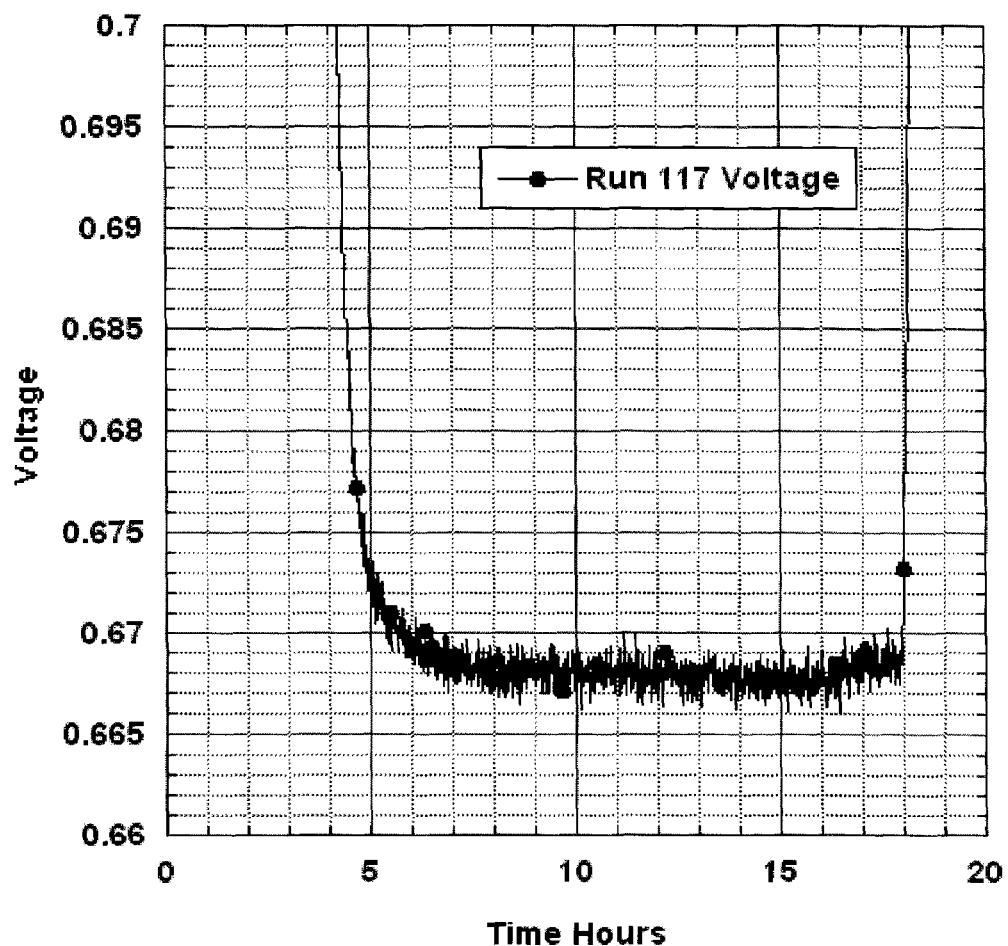
FIG. 13-C

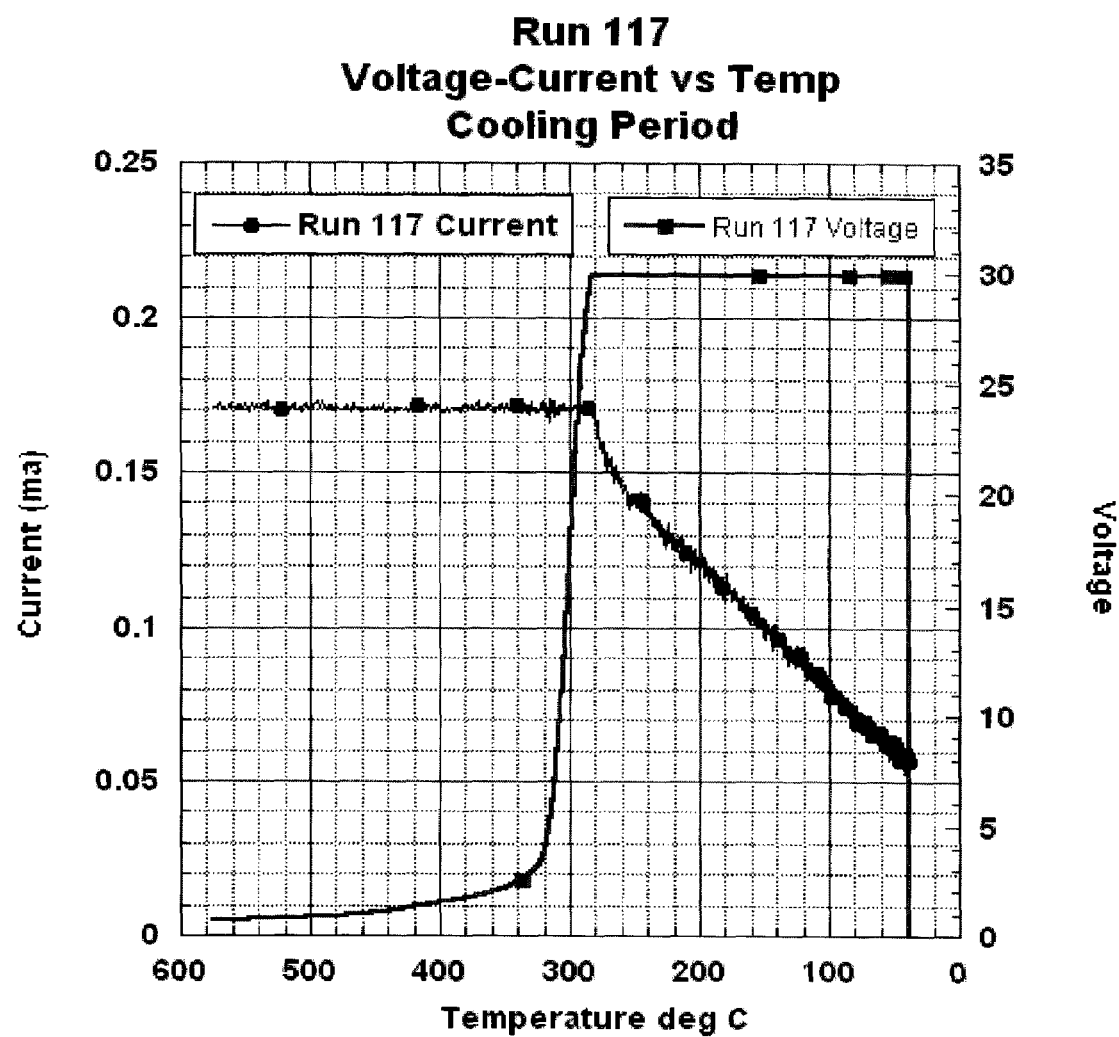
FIG. 13-D

SYSTEMS AND METHODS FOR ELECTRICALLY REDUCING FERROELECTRIC MATERIALS TO INCREASE BULK CONDUCTIVITY

RELATED APPLICATION DATA

This application claims the benefit of the filing date of U.S. Provisional Patent Application No. 60/847,483, filed Sep. 26, 2006, which is herein incorporated by reference.

BACKGROUND

The present invention relates generally to systems and methods for increasing the electrical conductivity of ferroelectric materials such as lithium niobate and lithium tantalate.

Lithium tantalate ($LiTaO_3$) and lithium niobate ($LiNbO_3$) are well known ferroelectric materials. Their single polar properties coupled with their transparency from 350 nm to 4000 nm make them useful for many non-linear optical applications. The piezoelectric properties of these crystals have found wide application as substrates for Surface Acoustic Wave (SAW) devices. A thin film inter digital transducer (IDT) deposited on the free surface of a piezoelectric crystal may be used for RF filters and IF filters in cellular phones and base stations, among others. Various rotated-axis cuts of $LiTaO_3$ have also been used to realize new and unique SAW devices for a number of applications. The trend for SAW devices using this material is to smaller area footprints and thinner wafer material.

Substantial progress has been made in producing exceptionally flat $LiTaO_3$ material with improved techniques in polishing and grinding. At the same time, many of the lithium tantalate treatment processes expose the material to potentially damaging high electrical fields due to pyroelectric effects produced within the crystal during various process heat treatments. High electric fields can be developed across semi-insulating pyroelectric crystals with relatively small changes in temperature. For a crystal such as $LiTaO_3$, whose pyroelectric coefficient is $10^{-8}$ $Coul/cm^2$ deg K and dielectric constant is 46, a 25° C. change can produce an electric field on the order of 50 kV, easily enough to create a discharge within the crystal or breakdown the air surrounding it. Pyroelectric effects can cause device fabrication problems including eventual device performance degradation, and in some cases catastrophic crystal fractures. To work around the inconvenience of these effects makes the fabrication process more costly and time consuming.

Charge build up during processing can be reduced by creating a more conductive crystal substrate. Increasing crystal conductivity may be achieved by using a reducing agent in a heat treatment close to the Curie temperature of the crystal. In U.S. Pat. No. 6,932,957, Miles et al. describe a method of increasing the bulk conductivity of lithium tantalate by placing the lithium tantalate in an environment including zinc vapor, and heating the lithium tantalate to below its Curie temperature.

SUMMARY

According to one aspect of the present invention, an electrical reduction method comprises heating a substantially single-domain body of a ferroelectric material selected from lithium niobate and lithium tantalate to a temperature below a Curie temperature of the body; and while maintaining the heated body below the Curie temperature in a non-oxidizing environment, applying a voltage across the body to increase a bulk conductivity of the body.

According to another aspect, a composition comprises a substantially single-domain, electrically-reduced body of lithium tantalate having an average optical absorption per 0.4 mm thickness greater than 50% at 300 nm and greater than 50% at 460 nm, and in particular between 60% and 80% at 300 nm and between 60% and 80% at 460 nm.

According to another aspect, a composition comprises a substantially single-domain, electrically-reduced body of lithium tantalate having an electrical conductivity higher than about $10^{-11}$ Siemens/cm ($10^{-11}$ $\Omega^{-1}$ $cm^{-1}$), and in particular between $10^{-9}$ Siemens/cm and $10^{-11}$ Siemens/cm.

According to another aspect, an apparatus comprises: a vacuum furnace comprising an internal chamber having a gas inlet for receiving a gas to establish a non-oxidizing environment in the internal chamber, a heater for heating the internal chamber, and a set of electrical contacts situated inside the internal chamber; a substantially single-domain body of a ferroelectric material selected from lithium niobate and lithium tantalate, wherein the body is connected to the electrical contacts; and a controller connected to the vacuum furnace, for controlling a heating of the furnace to heat the body to a temperature below a Curie temperature of the body, and controlling an applying the voltage across the contacts to increase a bulk conductivity of the body while the body is maintained in the non-oxidizing environment below the Curie temperature of the body.

BRIEF DESCRIPTION OF THE DRAWINGS

The foregoing aspects and advantages of the present invention will become better understood upon reading the following detailed description and upon reference to the drawings where:

FIG. 1 shows an electrode configuration used to apply a voltage across the faces of a boule according to some embodiments of the present invention.

FIGS. 2-A-B show top and isometric views of an electrode configuration used to apply a voltage across the sides of a boule according to some embodiments of the present invention.

FIG. 5-A illustrates electrically reducing stacks of ferroelectric material wafers using electrodes attached to the tops and bottoms of the stacks, according to some embodiments of the present invention.

FIG. 5-B shows a part of an exemplary stack of wafers suited for use in the arrangement of FIG. 5-A.

FIG. 6-A illustrates electrically reducing stacks of ferroelectric material wafers using electrodes attached to the sides of the stacks, according to some embodiments of the present invention.

FIG. 6-B shows a part of an exemplary stack of wafers suited for use in the arrangement of FIG. 6-A.

FIG. 8-A-B illustrate schematically two exemplary time-dependences of temperature, voltage and current according to some embodiments of the present invention.

FIG. 10-A shows exemplary optical absorption spectra for lithium tantalate wafers of identical thickness in an unprocessed state, following chemical reduction using a zinc vapor reduction process, and following an electrical reduction process performed according to an embodiment of the present invention.

FIG. 10-B shows exemplary optical absorption spectra for a 0.5 mm-thick lithium tantalate wafer chemically reduced using a zinc vapor reduction process, and for three 0.35 mm thick lithium tantalate wafers electrically reduced according to some embodiments of the present invention.

FIG. 11-A shows a variation of applied voltage with time for an exemplary electrical reduction process according to an embodiment of the present invention.

FIG. 11-B shows the results of conductivity measurements performed for 10 exemplary wafers electrically reduced according to an embodiment of the present invention.

FIG. 12-A shows variations of current and voltage with time for an exemplary electrical reduction process according to an embodiment of the present invention.

FIG. 12-B shows variations of current and sample temperature with time for an exemplary electrical reduction process according to an embodiment of the present invention.

FIG. 12-C shows an exemplary current response to an alternating voltage, indicative of material conductivity, according to an embodiment of the present invention.

FIG. 12-D shows a number of averaged material resistivity values corresponding to the data of FIG. 12-C, according to some embodiments of the present invention.

FIG. 13-A illustrates a spontaneous growth of measured current for an exemplary voltage-ramp process run, for a maximum voltage of 10 V, according to some embodiments of the present invention.

FIG. 13-B shows an exemplary measured temperature-dependence of current flow for a lithium tantalate wafer, according to some embodiments of the present invention.

FIG. 13-C shows an exemplary measured time-dependence of the applied voltage during the dwell phase for a lithium tantalate wafer, according to some embodiments of the present invention.

FIG. 13-D shows an exemplary measured temperature dependence of voltage and current for a lithium tantalate wafer, according to some embodiments of the present invention.

DETAILED DESCRIPTION OF PREFERRED EMBODIMENTS

Figure 3:
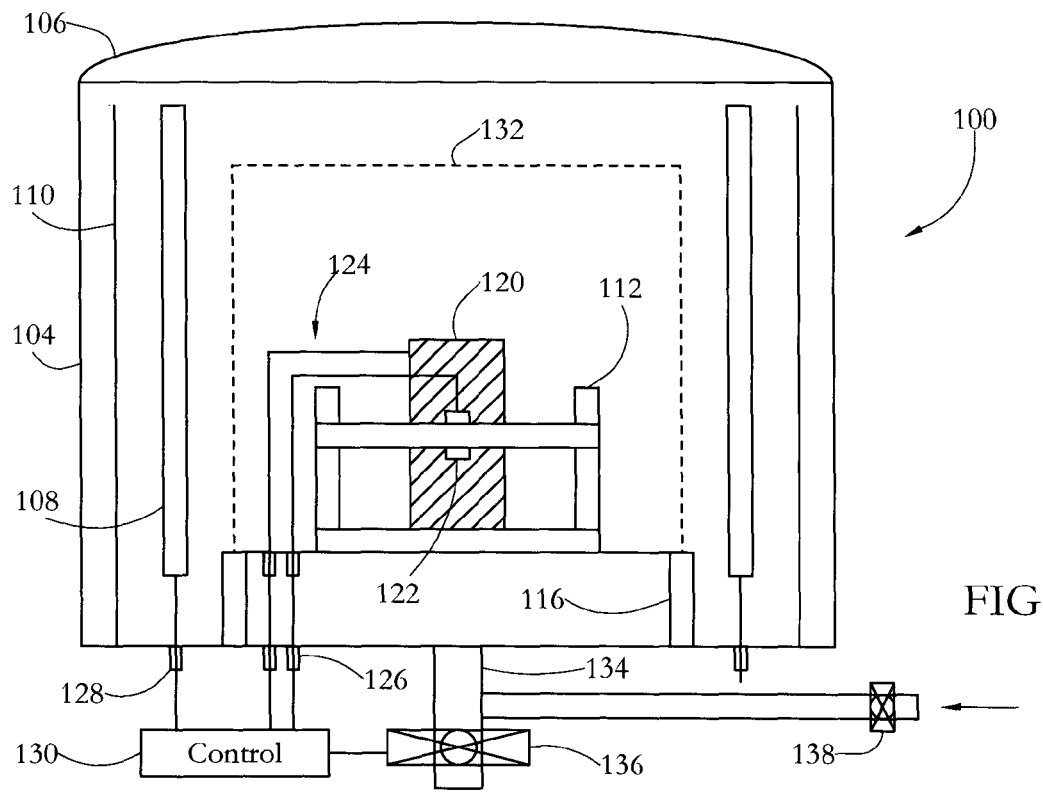
FIG. 3 shows a vacuum furnace system suitable for electrically reducing ferroelectric material boules according to some embodiments of the present invention.

The following description illustrates the present invention by way of example and not necessarily by way of limitation. Any reference to an element is understood to refer to at least one element. A set of elements is understood to include one or more elements. A plurality of elements includes at least two elements. Unless otherwise specified, any described method steps need not be necessarily performed in a particular illustrated order. Unless otherwise specified, applying a voltage across a body is not limited to applying the voltage using a constant-voltage DC source. Applying a voltage across a body encompasses applying a time-varying voltage, as well as connecting a constant-current or controlled-current source to the body to generate the applied voltage. Unless otherwise specified, any recited material (e.g. lithium tantalate) encompasses without limitation doped as well as undoped forms of the material. Unless otherwise specified, a DC voltage/current encompasses constant as well as time-varying DC voltages/currents. Such a time-varying voltage/current may include, for example, a smoothly-ramping DC voltage/current, or a rectified alternating voltage/current. The term boule refers to a single-crystal ingot. Unless otherwise specified, any recitation of an average optical absorption per a set length/depth (e.g. 0.4 mm thickness) refers to an average absorption scaled with the length/depth, regardless of any internal variations in optical absorption. Thus a wafer 0.3 mm-thick displaying an optical absorption of 40% has an average optical absorption of about 50% per 0.4 mm thickness, even if such a wafer exhibits variations in its optical absorption with depth that may result in different localized optical absorption characteristics at different depths.

According to some embodiments, the present invention provides systems and methods for the production of conductive ferroelectric materials, particularly lithium tantalate and/or lithium niobate via a reduction technique using direct charge transport by applying an external DC electric field along the polar axis of the ferroelectric material in a non-oxidizing environment (e.g. vacuum or inert or reducing environment).

FIG. 1 shows an electrical reduction assembly 20 using a voltage applied across the planar faces of a cylindrical boule, according to some embodiments of the present invention. Assembly 20 includes a cylindrical ferroelectric crystal body 22, a set of electrodes 24a-b disposed on opposite planar surfaces of body 22, and an electric power (voltage/current) source 26 connected to electrodes 24a-b, for applying a voltage across electrodes 24a-b, and thus across the bulk of body 22.

Body 22 may be a pre-poled, single-domain crystal of a ferroelectric material such as lithium niobate or lithium tantalate. FIG. 1 shows an exemplary polarization orientation oriented along a Z-axis situated at an acute angle with respect to the planar surface of body 22. Electrodes 24a-b may be formed by conductive coatings of a paste or paint of silver or other conductive materials. In some embodiments, each electrode 24a-b is formed by a two-layer coating an acetate-based silver paint. A conductive coating may be applied by brushing, dipping, spinning, spraying, or evaporation. The surface contact area may be cleaned and made uniform by lapping prior to forming electrodes 24a-b. Power source 26 may be a DC power supply capable of applying DC voltages on the order of tens of volts. Applying a voltage across electrodes 24 generates an electric field E within body 22. In some embodiments, the electric field E has a non-zero component along the direction of polarization of body 22, i.e. is not perpendicular to the direction of polarization.

FIGS. 2-A-B show top and isometric views, respectively, of an electrical reduction assembly 30 using a voltage applied across the curved sides of a cylindrical boule, according to some embodiments of the present invention. In assembly 30, a set of electrodes 34a-b are disposed on opposite lateral sides of body 22. In the configuration shown in FIGS. 2-A-B, each electrode 34a-b spans a 120° arc along the cylinder's circumference. Each electrode 34a-b is intimately connected to a corresponding contact 36a-b, which may be formed by a foil of platinum or another conductive material.

FIG. 3 shows a vacuum furnace system 100 suitable for electrically reducing ferroelectric material boules according to some embodiments of the present invention. A generally cylindrical vacuum furnace 104 includes a stainless steel lateral outer wall and a removable lid 106, which can be opened and closed using a handle and hinge. A plurality of heating elements 108 are positioned inside vacuum furnace 104, and are spaced symmetrically around a perimeter of vacuum furnace 104, in order to provide spatially-uniform heating inside vacuum furnace 104. Heating elements 108 are electrically connected to a controller 130 through feedthroughs 128. Controller 130 controls an operation of heating elements 108. A water-cooled baffle 110 is situated next to the outer wall of vacuum furnace 108, for thermally shielding the outer wall of vacuum furnace 104. A non-conductive holder 112 is situated on an elevated table 116 within furnace 104. Holder 112 supports a ferroelectric material boule 120.

A pair of silver-paint electrodes are formed on opposite surfaces of boule 120 as described above with reference to FIGS. 2-A-B. A platinum foil contact 122 is electrically connected to each electrode. A pair of platinum wires (leads) 124 provide an electrical connection between contacts 122 and an external controller 130. Wires 124 extend through the base of furnace 104 through feedthroughs 126. Controller 130 includes a DC power (voltage/current) supply capable for applying a voltage across wires 124. Applying a voltage across wires 124 may be achieved by connecting a constant or variable voltage/current source (e.g. a battery or DC power supply) to generate the voltage. In some embodiments, boule 120 is electrically connected in a forward bias configuration, with the negative polar face of boule 120 connected to the negative terminal of the power supply.

A hollow stainless steel or alumina cylinder 132 opened on one end is situated over boule 120, to add thermal stability and maintain a more uniform temperature during the reduction process. A gas inlet 134 is situated along the bottom of vacuum furnace 104. Gas inlet 134 is connected to a vacuum pump through a port 136, and to a source of non-oxidizing (inert or reducing) gas through a port 138. Controller 130 is connected to ports 136, 138 and/or the vacuum pump and the source of non-oxidizing gas, for controlling the atmospheric environment within vacuum furnace 104.

Figure 4:
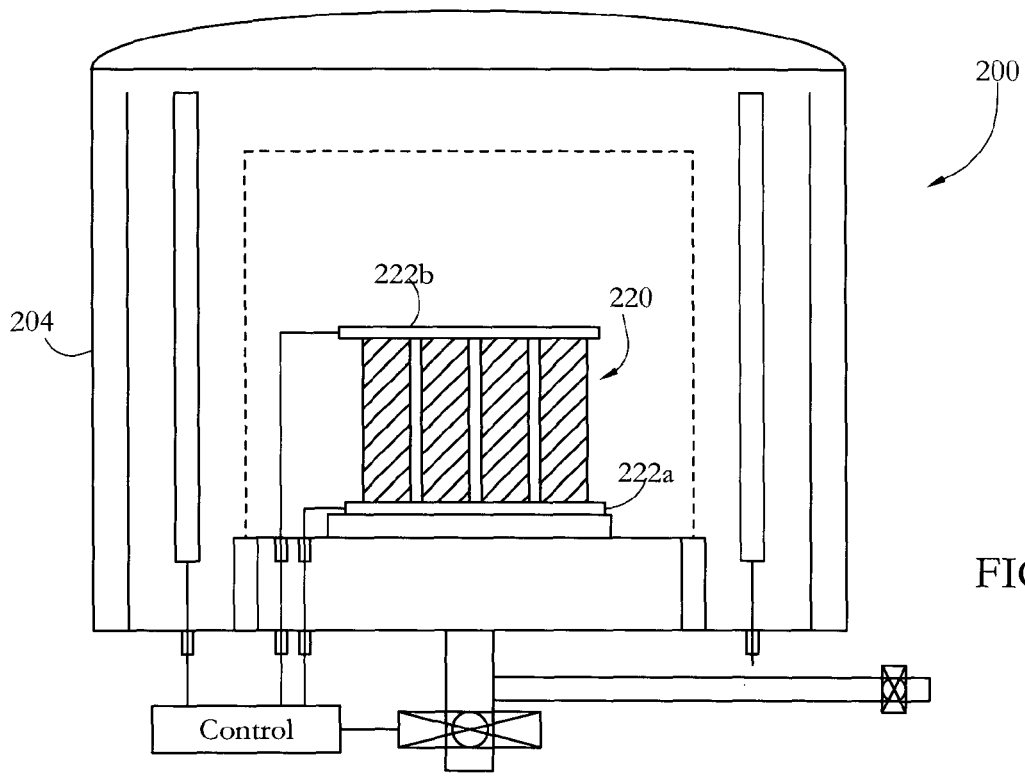
FIG. 4 shows a vacuum furnace system suitable for high-volume electrical reduction of ferroelectric material boules according to some embodiments of the present invention.

FIG. 4 shows a vacuum furnace system 200 suitable for high-volume electrical reduction of ferroelectric material boules 220 according to some embodiments of the present invention. A vacuum furnace 204 includes pair of planar contacts 222a-b connected across opposite planar faces of multiple boules 220. Boules 220 are electrically connected in parallel between contacts 222a-b and are reduced concurrently as described below.

FIG. 5-A shows a vacuum furnace system 300 suitable for electrically reducing stacks of ferroelectric material wafers 320 using electrodes attached to the tops and bottoms of the stacks, according to some embodiments of the present invention. A vacuum furnace 304 includes a pair of planar contacts 322a-b connected across opposite planar faces of multiple wafer stacks 320. Wafer stacks 320 are electrically connected in parallel between contacts 322a-b and are reduced concurrently as described below. As shown in FIG. 5-B, each wafer stack 320 includes multiple stacked wafers 340 separated by inter-wafer conductive layers 344. Conductive layers 344 may by acetate-based silver paint or other compositions such as the ones used for the electrodes 24a-b described with reference to FIGS. 1 and 2-A-B.

FIG. 6-A shows a vacuum furnace system 400 suitable for electrically reducing stacks of ferroelectric material wafers 420 using electrodes attached to the sides of the stacks, according to some embodiments of the present invention. A vacuum furnace 404 includes a pair of conductors 422a-b facing opposite planar faces of multiple wafer stacks 420. Wafer stacks 420 include lateral electrodes 424 disposed as described above with reference to FIGS. 2-A-B and connected to conductors 422a-b. Wafer stacks 420 are electrically connected in parallel between contacts 422a-b and are reduced concurrently as described below. As shown in FIG. 6-B, each wafer stack 420 includes multiple stacked wafers 440 laterally enclosed by electrodes 424.

Figure 7:
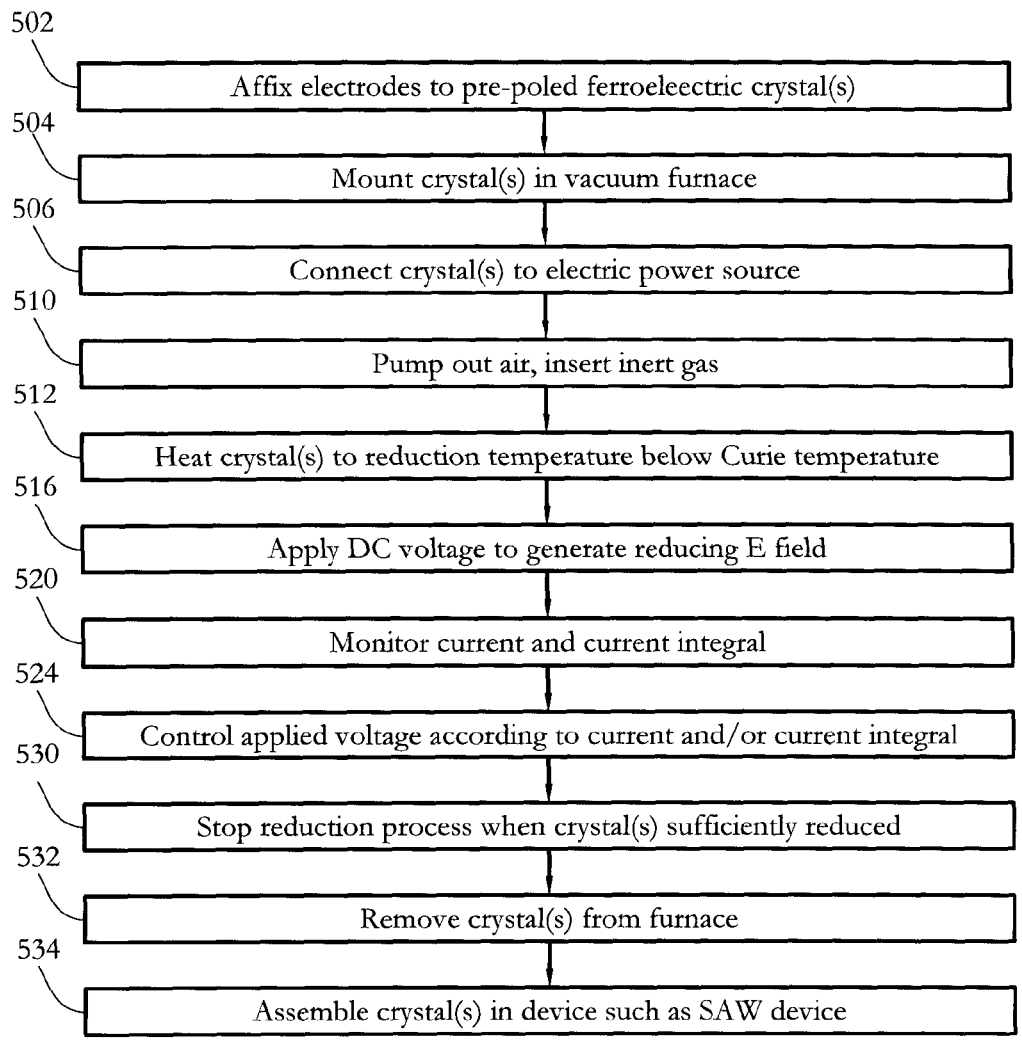
FIG. 7 shows an exemplary sequence of steps performed to electrically reduce a ferroelectric material according to some embodiments of the present invention.

FIG. 7 shows an exemplary sequence of steps performed to electrically reduce a lithium tantalate crystal according to some embodiments of the present invention. In a step 520, electrodes are affixed to one or more pre-poled lithium tantalate crystals. The crystal(s) may be provided as one or more ingots, boules, wafers or stacks of wafers as described above. The crystal(s) are mounted in a vacuum furnace (step 504), and the crystal electrodes are connected to an electric power source (step 506). In a step 510, the vacuum furnace lid is closed and sealed, the vacuum furnace chamber is pumped down to $5\times10^{-5}$ Torr via a vacuum pump, and the chamber is backfilled to a partial atmospheric pressure of 250 Torr with an inert gas (e.g. $N_2$) or reducing gas (e.g. forming gas). In a step 512, the interior temperature of the furnace is ramped at 80° C./hour until the crystal(s) reach a stable process temperature of 595° C., which is slightly lower than the Curie temperature of lithium tantalate (602-604° C.). In some embodiments, the crystal may be held at a temperature within 20° C. of its Curie temperature. The crystal temperature may be measured using a temperature sensor in thermal contact the crystal(s). The process temperature is maintained throughout the remainder of the reduction process described below. In a step 516, a DC voltage is applied to the electrodes to generate a reducing E field within the crystal(s). After a dwell time of approximately 3 hours at process temperature, a voltage ramp is applied to the crystal electrodes at a rate of 0.250 V/mm. until a desired voltage for the reduction process is reached.

The current flow through the crystal(s) and its time-integral are monitored (step 520). It was observed that even after the applied voltage is stabilized, the current through the crystal(s) continues to spontaneously grow in the presence of electronic charge filling charge vacancies within the lattice. The charge transport through the crystal(s) can be determined by monitoring the current and integrating the area under the current curve on a point-by-point basis. The applied voltage is controlled (e.g. stopped or reduced) according to the determined current and current integral values. In particular, it was observed empirically that when the charge density reaches about $1\times10^{+3}/cm^3$, the conductivity of the reduced lithium tantalate is about $1\times10^{-11}$ Siemens/cm. The reduction process is stopped when the crystal(s) have been sufficiently reduced (step 530). The process run may be terminated according to the acquired charge density, or after a set period of time sufficient to achieve a desired charge density to deliver a desired conductivity at room temperature. The reduction process may be terminated slowly as the furnace temperature is ramped down slowly (e.g. at 60° C./hour) for ingots, or faster for wafers. The applied voltage is allowed to remain constant, and the current begins to drop as the temperature drops. Maintaining a constant applied voltage throughout the temperature ramp-down prevents charge reversal during the long cool down period. After room temperature is reached, the crystal(s) are removed from the furnace (step 532). The reduced crystals may undergo further processing known in the art and be assembled in electronic devices such as surface acoustic wave (SAW) filter devices.

Applying an electric field along the polar axis of the crystal, which creates charge transport, facilitates the electrical reduction process. In the presence of excess free electrons, existing electronic vacancy sites are filled, which makes the material more conductive. Relevant process parameters include: applied voltage, charge transport (current), temperature, and process gas pressure.

In some embodiments, a process timeline may be characterized by a voltage ramp and/or a temperature ramp. FIG. 8-A-B illustrate schematically two exemplary time-dependences of temperature, voltage and current according to some embodiments of the present invention. The exemplary parameter values shown in FIGS. 8-A-B are illustrative of a wafer processing embodiment. In a voltage-ramp sequence whose beginning is shown in FIG. 8-A, the material is first allowed to come into thermal equilibrium at a stable process temperature, usually within a few degrees of the Curie temperature of the material. The process gas is also stabilized at this temperature. A voltage-ramp is then applied to the material electrodes. With increasing voltage a point is reached where the material becomes conductive, allowing electrons to flow. The voltage is ramped higher until the current begins to grow spontaneously, which indicates an increase in material conductivity due to charge accumulation. The voltage is then held fixed, typically for the duration of the process, and the current is allowed to grow spontaneously as more charge is accumulated in lattice anti-site vacancies. The fixed voltage value may be on the order of several volts to tens of volts for wafer processing, and is shown as 3 V in the exemplary illustration of FIG. 8-A. As the material becomes more conductive the current grows spontaneously, and may reach a value on the order of several amperes. FIG. 13-A illustrates a spontaneous growth of measured current for an exemplary voltage-ramp process run, for a maximum voltage of 10 V. The material reduction process may be characterized quantitatively by integrating the area under the current curve to determine the charge transport, which then may be related empirically to the accumulated charge density and material conductivity at room temperature.

In a temperature-ramp sequence shown in FIG. 8-B, a voltage and pressure are set at room temperature prior to ramping the process temperature. The process gas pressure is set at a value calculated to achieve a pressure slightly less than 1 atmosphere at a final process temperature following the thermal ramp. The pre-set voltage may be chosen according to the thickness of the material, so as to avoid creating unwanted electro-chemical effects at the electrode-crystal interface. To prevent such interface effects, the voltage may be chosen to yield a field below about 1 kV/cm. For a wafer 0.4 mm-thick, an electric field value of 1 kV/cm corresponds to a voltage of about 40 V. The current is allowed to increase with temperature but is clamped at a maximum value of about 1-2 $mA/cm^2$, pre-determined to avoid crystal damage. For a 4-inch wafer having a surface area of 81 $cm^2$, the current clamp value may be chosen to be between about 80 and 160 mA. The current may be clamped by reducing the applied voltage to maintain the current below the preset clamp.

The sequence of FIG. 8-B can be thought to include three phases. First, the sequence includes an onset or temperature-ramp phase 612, in which the crystal temperature rises to a value allowing current flow. The current flow may rise from micro amps to hundreds of milliamps over a relatively narrow temperature range and short period of time. FIG. 13-B shows an exemplary measured temperature-dependence of current flow for a lithium tantalate wafer. As FIG. 13-B shows, the current flow and associated reduction process in a temperature-ramp sequence may start at about 440° C., or about 150° C. lower than in the voltage-ramp sequence shown in FIG. 8-A. Also, the maximum applied voltage in the temperature-ramp sequence of FIG. 8-B may be substantially higher, e.g. 10 times higher, than in the voltage-ramp sequence of FIG. 8-A.

A dwell phase 614 follows onset phase 612 (FIG. 8-B). During the dwell phase, the current is allowed to increase up to a preset value, e.g. about 200 mA, and is then clamped at that pre-set value by reducing the applied voltage sufficiently to maintain the current at the preset value. FIG. 13-C shows an exemplary measured time-dependence of the applied voltage during the dwell phase for a lithium tantalate wafer. The current during the period shown in FIG. 13-C was limited to approximately 170 mA. In some embodiments, to increase the reduction efficiency during the dwell phase, the current limit may be slowly increased while allowing the voltage to moderately increase as well, as long as there is a net improvement in the material resistance, for example as long as the ratio V/I continues to decrease.

Finally, a cool-down phase 616 follows dwell phase 614 (FIG. 8-B). During the cool-down phase, the applied voltage rises and the current decreases as the material cools to room temperature. It is thought that maintaining a high voltage during cool down allows the conductive bands to become quenched in the crystalline structure, to help maintain the material's conductive properties at room temperature. FIG. 13-D shows an exemplary measured temperature dependence of voltage and current for a lithium tantalate wafer.

The approaches illustrated in FIGS. 8-A-B were observed to produce similar results, and either approach or combinations/hybrids of the two may be used in embodiments of the present invention. The temperature-ramp approach of FIG. 8-B is thought to potentially distribute charge density more uniformly throughout the bulk of the material in a relatively short time period. At the same time, the temperature-ramp approach of FIG. 8-B may employ higher voltages than the voltage-ramp approach of FIG. 8-A. In some embodiments, a process timeline may be chosen according to the body geometry and/or material properties such as doping. For example, a voltage-ramp approach of FIG. 8-A may be preferentially employed for boule reduction processes, which may employ voltages on the order of hundreds of V to kV.

Figure 9:
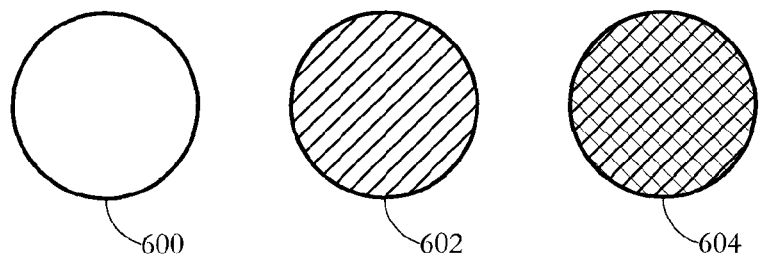
FIG. 9 illustrates schematically a visual appearance of lithium tantalate wafers in unprocessed form, following chemical reduction, and following electrical reduction according to some embodiments of the present invention.

The exemplary electrical reduction processes described above result in a number of changes to the electrical and optical properties of the lithium tantalate crystals. FIG. 9 illustrates schematically a visual appearance of lithium tantalate crystals in unprocessed form, following chemical reduction using zinc vapor, and following electrical reduction according to some embodiments of the present invention. An unprocessed wafer 600 has a transparent visual appearance. A wafer 602 reduced chemically using a zinc reduction process has a gray appearance, while an exemplary electrically-reduced wafer 604 reduced as described above has a darker gray-black visual appearance.

FIG. 10-A shows exemplary absorption spectra for a lithium tantalate wafer in an unprocessed state, following chemical reduction using zinc vapor, and following an electrical reduction process performed according to an embodiment of the present invention. Optical absorption properties were measured using a Varian® 500 spectrophotomer, for wafers of identical thickness. The electrical reduction process allows achieving average absorption (100% minus transmission) values greater than 50% per 0.4 mm thickness at a wavelength of 300 nm, and greater than 50% per 0.4 mm thickness at a wavelength of 460 nm. Varying process and/or material parameters (e.g. length of reduction process, applied voltage, wafer thickness, may allow achieving other optical absorption properties such as absorption values per 0.4 mm thickness of 60-80% (e.g. about 70%) or higher at 300 nm and 60-80% or higher (e.g. about 70%) at 460 nm. The wavelength of 300 nm is of particular interest since 300 nm corresponds approximately to a second ionization energy level in lithium tantalate. The data shown in FIG. 10-A exhibits a non-monotonic absorption curve, with an optical absorption trough around 460 nm and an optical absorption substantially greater at 460 nm than at 350 nm.

FIG. 10-B shows exemplary optical absorption spectra for a 0.5 mm-thick lithium tantalate wafer chemically reduced using a zinc vapor reduction process (labeled "Conventional PF"), and for three 0.35 mm thick lithium tantalate wafers electrically reduced according to some embodiments of the present invention (labeled "MG Materials"). The data of FIG. 10-B again shows higher optical absorption (100%-transmission) values for the electrically-reduced wafers than for the chemically reduced one, even through the electrically-reduced wafers were substantially thinner. If the transmission of a given thickness of material is taken to be equal to the transmission per unit thickness to the power of the thickness, linearly scaling an optical absorption value of about 70% per 0.35-mm thickness (see FIG. 10-B) leads to a scaled optical absorption value of about 75% per 0.4-mm thickness.

A number of tests were run to evaluate electrically reducing boule and wafer lithium tantalate samples. Exemplary results of such tests are described below. The following examples illustrate aspects of particular embodiments of the present invention, and do not limit the scope of the invention.

In one process run, the electrically reduced body was a $LiTaO_3$ ingot 25.6 mm thick, 101.6 mm in diameter, and having an area of 81 $cm^2$, a volume of 210.79 $cm^3$, and a Y-axis rotated angle of 42°. The material was prepared and processed as a single ingot in an apparatus as shown in FIG. 4. The process was performed according to the steps outlined in FIG. 7, specifically as follows. The Y-faces of the ingot were as cut. The ingot was cleaned with solvents such as acetone, isopropanol, and deionized water. The crystal Y-faces were coated with two layers of acetate-based silver paint, available from GC Electronics, Rockford, Ill., catalog number GC-220023-0000. The electrodes resulting from the silver paint application were electrically contacted with Pt foils. The boule was placed in a vacuum furnace fitted with a six-inch diameter hearth, electrical feedthroughs and platinum leads for connecting to the crystal electrodes. The positive electrode of a power supply was connected to the positive crystal pole, and the negative electrode of the power supply was connected to the negative crystal pole. The vacuum furnace chamber was pumped down to $2.5 \times 10^{-5}$ Torr using a diffusion pump, and back filled to 250 Torr of forming gas ($N_2 \backslash H_2$ 85\15%) at room temperature. The furnace temperature was then ramped at 120° C./hour to a process temperature of 595° C. After the furnace was held at 595° C. for 3 hours, the voltage applied to the boule was ramped at a rate of 0.25 V/minute to a voltage set point of 15 V. The electrical reduction process was allowed to run for about 35 hours. The appearance of the boule at the end of the process was black and totally opaque.

FIG. 11-A shows the relationship of the voltage and current with time over the 35-hour process run. The current was observed to rise from about 175 mA at the end of the voltage ramp to about 4.0 A over the process run of 35 hours. The total charge transport was determined to be $3.95 \times 10^{+5}$ Coulomb, which corresponds to an acquired volumetric charge of $1.87 \times 10^{+3}$ Coul/$cm^3$. The charge transport may be determined by integrating the current through the crystal. Ten wafers 0.43 mm-thick were rendered from the center of the processed boule and measured for conductivity. FIG. 11-B shows conductivity data for these wafers. The average conductivity for the 10 wafers was found to be $1.0 \times 10^{-11}$ Siemens/cm.

In another process run, the electrically reduced body was a $LiTaO_3$ wafer 0.41 mm-thick, having a 101.6 mm diameter, an area of 81 $cm^2$, volume of 3.32 $cm^3$, and a Y-axis rotated angle of 38°. The wafer material was prepared and processed as a single wafer in apparatus similar to that shown in FIG. 5-A, configured for a single wafer. The process was performed according to the steps outlined in FIG. 7, specifically as follows. The Y-faces of the wafer were as cut. The wafer was soaked in an n-propyl-bromide solvent (Leksol®), rinsed in a stream of Leksol® from a squeeze bottle, placed soaked without drying in acetone, rinsed without drying in a stream of acetone, soaked in methanol then rinsed in a stream of methanol without drying, and soaked in 2-propanol. In this exemplary process run, the wafer was then washed and scrubbed with mild detergent, placed on absorbent paper cloth, and blown dry with $N_2$ on both sides, and etched in hydrofluoric acid for 5 minutes. If the wafer is not be etched, the washing and scrubbing with mild detergent may be replaced by rinsing in deionized water. Etching may help with cleaning a wafer, but may also cause internal defects in the wafer.

The Y-faces were coated with two layers of acetate-based silver paint. The electrodes resulting from the silver paint application were electrically contacted with Pt foils. The wafer was placed in a vacuum furnace fitted with a six-inch diameter hearth, electrical feedthroughs and platinum leads for connecting to the crystal electrodes. The positive electrode of a power supply was connected to the positive crystal pole, and the negative electrode of the power supply was connected to the negative crystal pole. The vacuum furnace chamber was pumped down to $2.5 \times 10^{-6}$ Torr using a turbo pump. The furnace temperature was then ramped at 120° C./hour to a process temperature of 595° C. The chamber was continuously pumped during the thermal ramp to avoid interference from out-gassing acetate by-products. After the furnace was held at 595° C. for 3 hours, the chamber was back-filled to 700 Torr of forming gas ($N_2 \backslash H_2$ 85\15%) at the process temperature, and the voltage applied to the wafer was ramped at a rate of 0.25 V/minute to a voltage set point of 2.5 V. The electrical reduction process was allowed to run for about 14 hours.

FIG. 12-A shows the relationship of the voltage and current with time over the 14-hour process run. The current was observed to rise from about 1.4 A at the end of the voltage ramp to 1.54 A over the process run of 14 hours. The total charge transport was determined to be $3.95 \times 10^{+5}$ Coul, which corresponds to an acquired volumetric charge of $2.01 \times 10^{+4}$ Coul/$cm^3$. The electrical reduction process was allowed to thermally terminate, with the voltage still applied to assure no reverse process occurred during the long cool down phase. FIG. 12-B shows the relationship of the sample temperature and current with time over the 14-hour process run. After the wafer was returned to room temperature, the conductive coating was easily removed by mechanical means, using a single edged razor blade in this case, and the wafer was washed in acetone and dried.

High resistance measurements were made on the wafer to determine the volume conductivity of the material. Measurements were made using a Keithley® 801 high resistance probe and Keithley® 3517A electrometer. An alternating 50 V 15-second DC pulse was applied, and the current response measured. A weighted average of the measured current for each successive pulse was taken with the resultant used to determine the material resistivity. The measured current response is shown in FIG. 12-C, while FIG. 12-D shows material resistivity data determined from the current response. From this data the resulting conductivity was measured to be $7.22 \times 10^{-10}$ Siemens/cm. The wafer was thinned to 0.35 mm by polishing, and re-measurement confirmed there was no substantial loss in conductivity following the thinning process. The wafer was also thermally cycled in air at 300° C. with no substantial degradation in conductivity.

The following discussion reflects the inventor's beliefs regarding mechanisms through which electrical reduction proceeds and other aspects of electrical reduction, and is not intended to limit the scope of the invention. As the ferroelectric material is heated close to the Curie temperature in a partial vacuum of inert gas, reduction begins to take place in the material as oxygen atoms deplete the crystal creating excess electrons.

An additional external voltage applied via electrodes sets up a uniform electrical field having at least a component along the polar axis of the material. As electrons are accelerated through the material they are captured in the available oxygen vacancies. Unlike in a purely chemically-induced reduction process, increasing the voltage of the external field allows increasing the number of available free electrons, thus increasing the Fermi level in the energy bands and allowing electrons to occupy higher energy-state sites. As the presence of the electronic charge builds, the conductivity of the material increases, and an accompanying spontaneous growth in current for a set voltage is observed. Monitoring the current growth under these conditions provides a real time measurement of the reduction in the crystal. Integrating the area under the current growth curve on a point-by-point basis gives a real time measure of the charge transport through the material. The charge transport density for a given volume can be used as a metric for the reduction process in terms of material conductivity, where, for instance, a charge transport density of $1.0 \times 10^{+3}$ Coul/cm$^3$ indicates the room temperature volume conductivity of the material is on the order of $1.0 \times 10^{-11}$ Siemens/cm.

The value of voltage applied to the sample may be determined empirically according to the thickness of the sample (for example, to achieve a given unit voltage along the length of the polar axis) and the rotational orientation of the Y-axis. The applied voltage may also be chosen according to the resistive drop across the electrode material, which is influenced by the coating conductivity and how tightly the conducting electrode layer bonds to the surface of the crystal at the process temperature. Process uniformity is enhanced if the conductive electrode layer forms a uniform bond to the crystal surface. The acquired volume charge density, which is directly related to the resultant material conductivity, may be used as a process metric. The applied voltage may be selected so as to generate enough charge density per unit volume to achieve a desired conductivity.

Using an external voltage to facilitate the reduction process provides a flexible mechanism to optimize and control the reduction process to achieve desired results, such as increased conductive uniformity over a greater depth. This process can be made more efficient by scaling the parameters up from a wafer process to bulk ingots.

An exemplary electrical reduction process as described above was observed to allow producing lithium tantalate crystals with superior conductivity characteristics, in particular conductivity values on the order of $1.0 \times 10^{-11}$ to $1.0 \times 10^{-9}$ Siemens/cm. Measurements performed on lithium tantalate chemically reduced by a zinc reduction process as described in the above-referenced U.S. Pat. No. 6,932,957 yielded conductivity values on the order of $1.0 \times 10^{-13}$ to $1.0 \times 10^{-12}$ Siemens/cm.

It is believed that a chemical reduction process as described in the above-referenced U.S. Pat. No. 6,932,957 strips oxygen atoms from the surfaces of lithium tantalate wafers, creating an excess of free electrons and creating an electrical imbalance in the crystal. Oxygen atoms begin migrating toward the surface and electrons are pulled into their vacancies to equilibrate the charge imbalance. As the number of electrons increases within the crystal lattice, color centers form, leaving the material less transparent with a gray-black cast and more conductive with the presence of the electrons. The process is driven by the potential energy acquired from the interaction of the reducing material with the ionic bonds of the oxygen in the tantalate-octahedral. This energy also determines where in the lattice the electrons will reside and how tightly they are bound. The available vacancy sites are associated with energies corresponding to the ionization state of the defect lattice. If the electron doesn't possess sufficient energy it cannot occupy sites with a higher ionization potential. Such sites are also more difficult to re-oxidize when exposed to air at high temperatures.

Presently available chemical reduction processes designed to increase volume conductivity in LiTaO$_3$ and LiNbO$_3$ may be limited in practice to reducing agents which can be applied to the surface uniformly at a process temperature below the Curie temperature of the material, which can effectively form an intimate bond with the surface near the Curie temperature of the crystal, and still produce the amount of charge required to achieve a desired level of conductivity. The options for reducing LiNbO$_3$ are generally broader than for LiTaO$_3$, since the Curie temperature for LiNbO$_3$ is above 1000° C. At these high temperatures, almost any inert atmosphere can create the required conditions for reduction in LiNbO$_3$. Lithium tantalate, however, is generally more difficult to reduce. Lithium tantalate has a low Curie temperature of about 604° C. At this temperature the oxygen bonds within the crystal lattice are stronger, requiring a greater reduction potential. These constraints limit the candidates for a reducing medium that can generate the adequate reduction potential to create highly conductive material. Chemical reduction of the crystal using reactive metal vapor or high-temperature alkali metal coatings may limit the effectiveness of the process to a relatively narrow range of reduction potentials. For example, due to the relatively low reduction potentials of metal vapors, higher conductivities desirable for emerging technologies may be difficult to achieve with a chemical reduction process using metal vapors. Variations in the crystal orientation, which occurs due to some Y-rotational cuts for various SAW device applications, may also pose problems for a chemical reduction process, due to the geometric orientation of oxygen octahedra to the polar axis of the crystal, which forms a path for electronic transport. Some rotated Y-axis configurations may require higher energies for occupation of the depleted sites. The required electronic energy may increase beyond the capability of the reduction potential to effectively reduce the material. Therefore the process may be effective for one orientation, but not have enough energy to sufficiently reduce another.

It will be clear to one skilled in the art that the above embodiments may be altered in many ways without departing from the scope of the invention. For example, the present disclosure provides numerous specific details such as examples of apparatus, process parameters, process steps, and materials to provide a thorough understanding of embodiments of the invention. Persons of ordinary skill in the art will recognize, however, that the invention can be practiced without one or more of these specific details. In other instances, well-known details are not shown or described to avoid obscuring aspects of the invention. Moreover, although embodiments of the present invention are described mainly in the context of lithium tantalate, an electrical reduction process according to embodiments of the present invention need not be so limited. Those of ordinary skill in the art can use the teachings of the present invention to increase the bulk conductivity of other ferroelectric materials such as lithium niobate, for example. Accordingly, the scope of the invention should be determined by the following claims and their legal equivalents.

What is claimed is:

1. A method of increasing a bulk conductivity of a ferroelectric material selected from lithium niobate and lithium tantalate, the method comprising:
   heating a substantially single-domain body of the material to a temperature below a Curie temperature of the material; and
   while maintaining the heated body below the Curie temperature in a non-oxidizing environment, applying a voltage across the body to induce an electrical current flow through the body to increase a bulk conductivity of the body.

2. The method of claim 1, wherein applying the voltage generates an electric field having a component along a polar axis of the body.

3. The method of claim 2, wherein the electric field is substantially parallel to the polar axis.

4. The method of claim 1, further comprising monitoring the current flowing through the body as a result of the voltage applied across the body, and controlling the voltage applied across the body according to the current flowing through the body.

5. The method of claim 4, wherein controlling the voltage according to the current comprises:
   determining a time-integral of the current flowing through the body, and
   controlling the voltage applied across the body according to the time-integral of the current flowing through.

6. The method of claim 4, wherein controlling the voltage according to the current flowing through the body comprises controlling the voltage to cap the current flowing through the body under a predetermined current threshold.

7. The method of claim 1, wherein maintaining the heated body below the Curie temperature comprises maintaining the heated body at a temperature within 20° C. of the Curie temperature.

8. The method of claim 1, further comprising applying the voltage across the body before heating the body.

9. The method of claim 1, wherein applying the voltage comprises ramping up the voltage over time.

10. The method of claim 1, further comprising allowing the body to cool to room temperature while applying the voltage across the body.

11. The method of claim 1, wherein the ferroelectric material is lithium tantalate.

12. The method of claim 1, wherein the ferroelectric material is lithium niobate.

13. The method of claim 1, wherein the non-oxidizing environment is a partial vacuum of an inert gas.

14. The method of claim 1, wherein the body comprises a wafer.

15. The method of claim 14, wherein the wafer forms part of a wafer stack comprising a plurality of stacked wafers, and wherein applying the voltage across the body comprises electrically connecting electrodes disposed on opposite surfaces of the wafer stack to a power source.

16. The method of claim 15, wherein the opposite surfaces are planar surfaces.

17. The method of claim 15, wherein the opposite surfaces are curved lateral surfaces.

18. The method of claim 1, wherein the body comprises a boule.

19. The method of claim 18, wherein the boule is one of a plurality of aligned substantially identical boules, and wherein applying the voltage across the body comprises concurrently electrically connecting the plurality of aligned boules to a power source.

20. The method of claim 1, comprising applying the voltage for a time sufficient to yield a body bulk conductivity value higher than $10^{-11}$ Siemens/cm.

21. The method of claim 1, comprising applying the voltage for a time sufficient to yield a body average optical absorption greater than 50% per 0.4 mm thickness at a wavelength of 300 nm; and greater than 50% per 0.4 mm thickness at a wavelength of 460 nm.

22. A substantially single-domain body of a ferroelectric material selected from lithium niobate and lithium tantalate, made by a process comprising:
   heating the body in a substantially single-domain state to a temperature below a Curie temperature of the material; and
   while maintaining the heated body below the Curie temperature in a non-oxidizing environment, applying a voltage across the body to induce an electrical current flow through the body to increase a bulk conductivity of the body.

23. The body of claim 22, wherein the material is lithium tantalate.

24. The body of claim 22, wherein the material is lithium niobate.

25. A surface acoustic wave (SAW) device comprising:
   an input transducer;
   an output transducer; and
   a piezoelectric substrate coupling the input transducer to the output transducer, the piezoelectric substrate comprising a substantially single-domain body of a ferroelectric material selected from lithium niobate and lithium tantalate, made by a process comprising:
      heating the body in a substantially single-domain state to a temperature below a Curie temperature of the material; and
      while maintaining the heated body below the Curie temperature in a non-oxidizing environment, applying a voltage across the body to induce an electrical current flow through the body to increase a bulk conductivity of the body.

26. The device of claim 25, wherein the material is lithium tantalate.

27. The device of claim 25, wherein the material is lithium niobate.

28. An apparatus comprising:
   a vacuum furnace comprising an internal chamber having a gas inlet for receiving a non-oxidizing gas to establish a non-oxidizing environment in the internal chamber, a heater for heating the internal chamber, and a set of electrical contacts situated inside the internal chamber;
   a substantially single-domain body of a ferroelectric material selected from lithium niobate and lithium tantalate, wherein the body is situated inside the vacuum furnace and is connected to the electrical contacts; and
   a controller connected to the vacuum furnace, for controlling a heating of the furnace to heat the body to a temperature below a Curie temperature of the body, and controlling an application of a voltage across the contacts to induce an electrical current flow through the body to increase a bulk conductivity of the body while the body is maintained in the non-oxidizing environment below the Curie temperature of the body.

29. The apparatus of claim 28, wherein the material is lithium tantalate.

30. The apparatus of claim 28, wherein the material is lithium niobate.

31. The method of claim 1, wherein the electrical current has a value exceeding 100 mA.

* * * * *